US 6,541,326 B2

(12) United States Patent
Fujiwara

(10) Patent No.: US 6,541,326 B2
(45) Date of Patent: Apr. 1, 2003

(54) NONVOLATILE SEMICONDUCTOR MEMORY DEVICE AND PROCESS OF PRODUCTION AND WRITE METHOD THEREOF

(75) Inventor: Ichiro Fujiwara, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/828,590

(22) Filed: Apr. 6, 2001

(65) Prior Publication Data

US 2001/0030340 A1 Oct. 18, 2001

Related U.S. Application Data

(62) Division of application No. 09/431,076, filed on Nov. 1, 1999.

(30) Foreign Application Priority Data

Nov. 4, 1998 (JP) .......................... 10-313734
Mar. 15, 1999 (JP) .......................... 11-069101

(51) Int. Cl.⁷ .......................... H01L 21/8238
(52) U.S. Cl. .................. 438/211; 438/264; 438/529; 365/185.11; 365/185.22
(58) Field of Search ................. 438/264, 529; 257/315; 365/185.11, 185.22, 185.24, 230.06

(56) References Cited

U.S. PATENT DOCUMENTS

| 5,596,214 A |   | 1/1997 | Endo ..................... 257/324 |
| 5,877,054 A | * | 3/1999 | Yamauchi ................ 438/264 |
| 5,978,270 A | * | 11/1999 | Tanaka et al. .......... 365/185.11 |
| 6,060,743 A |   | 5/2000 | Sugiyama et al. ........ 257/321 |

* cited by examiner

Primary Examiner—David Nelms
Assistant Examiner—Mai-Huoung Tran
(74) Attorney, Agent, or Firm—Rader, Fishman & Grauer, PLLC; Ronald P. Kananen, Esq.

(57) ABSTRACT

A nonvolatile semiconductor memory device featuring a reducing operating voltage while maintaining a good disturbance characteristic and high speed in a write operation, including a gate insulating film and gate electrode stacked on a channel forming region of a semiconductor provided on the surface of a substrate and planarly dispersed charge storing means such as carrier traps in a nitride film or near the interface with the top insulating film, provided in the gate insulating film, the gate insulating film including an FN tunnel film having a dielectric constant larger than that of a silicon oxide film and exhibiting an FN electroconductivity, whereby the thickness of the gate insulating film, converted to that of a silicon oxide film, can be reduced and the voltage can be reduced. Further, to reduce the operation voltage, it is possible to provide a pull-up electrode near the gate electrode through the dielectric film and pull-up gate bias circuit supplying a predetermined voltage to the same and boost the gate electrode by capacity coupling.

5 Claims, 18 Drawing Sheets

1a

NONVOLATILE SEMICONDUCTOR MEMORY DEVICE AND PROCESS OF PRODUCTION AND WRITE METHOD THEREOF

This application is a division of application Ser. No. 09/431,076, filed Nov. 1, 1999.

BACKGROUND OF THE INVENTION

1. Field of the Invention

The present invention relates to a nonvolatile semiconductor memory device providing planarly dispersed charge storing means (for example, charge traps in a nitride film in a MONOS type or MNOS type transistor, charge traps near the interface of a top insulating film and nitride film, small particle size conductors, and so forth) inside of a gate insulating film between a channel forming region and gate electrode of a memory transistor and basically operating to electrically inject charges (electrons or holes) into the charge storing means to store the same or to drain the same and to a process for production and write method for the same.

2. Description of the Related Art

As a nonvolatile semiconductor memory, a floating gate (FG) type nonvolatile semiconductor memory where charge storing means (floating gates) for holding charges are planarly dispersed, and a metal-oxide nitride-oxide semiconductor (MONOS) type nonvolatile semiconductor memory for example where the charge storing means are planarly dispersed are known.

In a MONOS type nonvolatile semiconductor memory, carrier traps in a nitride film ($Si_xN_y$ ($0<x<1$, $0<y<1$)) mainly responsible for holding charges or at a boundary (an interface) between a top oxide film and the nitride film spread out spatially dispersedly (that is, in the planar direction and thickness direction), so the charge retention characteristic is dependent on the energy and spatial distribution of the charges captured by the carrier traps in the $Si_xN_y$ film.

When leakage current paths are locally generated in the tunnel insulating film, in the FG type nonvolatile semiconductor memory, a large number of the charges pass through the leakage current paths and the charge retention characteristic tends to decline, while in the MONOS type nonvolatile semiconductor memory, since the charge storing means are spatially dispersed, the local charges around the leakage current paths pass through the leakage current paths and only local leakage occurs so the charge retention characteristic of the storage element as a whole does not easily fall.

Therefore, in the MONOS type nonvolatile semiconductor memory, the problem of the reduction of the charge retention characteristic due to a reduction in the thickness of the tunnel insulating film is not as serious as that in the FG type nonvolatile semiconductor memory. Therefore, the scaling of a tunnel insulating film in a fine memory transistor with an extremely short gate length is better in the MONOS type nonvolatile semiconductor memory than the FG type nonvolatile semiconductor memory.

In a MONOS type nonvolatile semiconductor memory or other nonvolatile semiconductor memory with planarly dispersed charge storing means of the memory transistors, it is essential to realize a one-transistor type of cell structure in order to reduce the cost per bit, increase the degree of integration, and realize a large-sized nonvolatile semiconductor memory.

In a MONOS type nonvolatile semiconductor memory or other nonvolatile semiconductor memory of the related art, however, the mainstream configuration has been for a two-transistor cell with a selected transistor connected to the memory transistor. At the present time, various studies are underway for establishment of single transistor cell technology.

In order to establish such single transistor cell technology, it is necessary to optimize the device structure, primarily the gate insulating film including the charge storing means, and improve the reliability and also to improve the disturbance characteristic. Further, as one measure for improving the disturbance characteristic of a MONOS type nonvolatile semiconductor memory, studies are being conducted on setting the tunnel insulating film thicker (1.6 nm to 2.0 nm).

Further, in order to reduce the cost per bit of a nonvolatile semiconductor memory and increase the integration density, it is necessary to miniaturize the memory cell and also reduce the area of the surrounding circuits. In reducing the area of surrounding circuits, it is important to reduce the write voltage and erase voltage from the viewpoint of ensuring the reliability along with miniaturization of the memory cell and reducing the circuit load of the surrounding circuits. Further, even in a system LSI, where there has been active development going on in recent years, it is becoming important to reduce the operating voltage from the viewpoint of mounting together with logic circuits.

Summarizing the problem, in a MONOS type nonvolatile semiconductor memory or other nonvolatile semiconductor memory with planarly dispersed charge storing means of the related art, setting the tunnel insulating film relatively thick in order to improve the disturbance characteristic limits the reduction of the operating voltage. That is, in a nonvolatile semiconductor memory of the related art, there is a tradeoff between making the tunnel insulating film thicker and reducing the operating voltage while maintaining a fast operating rate. Due to this, it suffers from the problem that it is not possible to simultaneously improve the disturbance characteristic and reduce the operating voltage.

SUMMARY OF THE INVENTION

An object of the present invention is to provide a nonvolatile semiconductor memory such as a MONOS type nonvolatile semiconductor memory which operates by storing charges in planarly dispersed carrier traps and which has a better scaling of the tunnel insulating film than the FG type nonvolatile semiconductor memory, where it is possible to reduce the operating voltage while maintaining an excellent disturbance characteristic, and a process for the production of the same.

Another object of the present invention is to provide a write method in a nonvolatile semiconductor memory, including a bias setting method preferable to the cell structure.

According to a first aspect of the present invention, there is provided a nonvolatile semiconductor memory comprising: a substrate; and a plurality of memory transistors formed in the substrate and arranged in a word direction and a bit direction, each memory transistor including: a semiconductor channel forming region formed in the substrate; a gate insulating film formed on the semiconductor channel forming region and comprising a Fowler-Nordheim (FN) type tunneling film which has a FN type tunneling electro-conductivity and contains material having a dielectric constant greater than that of silicon oxide; a gate electrode formed on the gate insulating film; and a charge storing means, formed in the gate insulating film, and facing to the surface of the channel forming region.

The FN tunneling film comprises any one of a nitride film, an oxynitride film, and aluminum oxide film, a tantalum pentaoxide film and a BST (BaSrTiO$_3$) film, having an FN tunneling electroconductivity.

The gate insulating film includes a buffer layer formed between the FN tunneling film and the channel forming region and suppressing an interface trap level.

The gate insulating film may comprise a Pool-Frenkel (PF) type film including any one of a nitride film, an oxynitride film, and aluminum oxide film, a tantalum pentaoxide film and a BST (BaSrTiO$_3$) film, having an PN type electroconductivity.

The nonvolatile semiconductor memory device may further comprises a pull-up electrode in the vicinity of the gate electrode or a wiring layer connected to the gate electrode, via a dielectric film; and a pull-up gate bias means for applying a voltage to the pull-up electrode.

A plurality of gate electrodes of the plurality of memory transistors are connected to a plurality of word lines, and a selected transistor is connected between the pull-up gate bias means and the pull-up electrode, the pull-up gate bias means supplying a voltage having a polarity that is the same as a polarity of a boosting voltage for boosting the precharged word line by a capacitance coupling.

The pull-up electrode may be arranged in the vicinity of an upper portion of the gate electrode or a connection layer connected to the gate electrode, via the dielectric film.

Each memory transistor comprises a source region contacted to the channel forming region, and a drain region spaced to the source region and contacted to the channel forming region, a plurality of gate electrodes of the plurality of memory transistors are connected to a plurality of word lines, the source region and drain region of each memory transistor are connected to a common line in a bit direction, electrically insulated to and intersecting to the word line. The nonvolatile semiconductor memory device further comprises a write inhibit voltage supply means for supplying a reverse-biased voltage to the source region and/or the drain region of the memory transistor the gate electrode of which is connected to the word line selected at a writing, through the common line, to make the source region and/or the drain region in a reverse-biased state to the channel forming region, and a non-selected word line biasing means for supplying a voltage to a non-selected word line at the writing, a polarity of the voltage being a polarity making the non-selected word line in a reverse biased state to the channel forming region.

The write inhibit voltage supply means supplies the reverse bias voltage to the source region and/or the drain region to make a bias voltage of the memory transistor connected to the selected word line to thereby prevent an erroneous write and/or an erroneous erase.

The non-selected word line biasing means supplies a voltage having a polarity for reverse-biasing to the non-selected word line to make a bias voltage of the memory transistor connected to the non-selected word line to thereby prevent an erroneous write and/or an erroneous erase.

The non-selected word line biasing means biases the gate electrode to the source region so that a voltage of the gate electrode becomes a low level equal to or lower than an inhibit gate voltage.

When the reverse bias voltage is supplied to the channel forming region while the gate electrode and the channel forming region of the memory transistor are kept at a same potential level, depletion layers extend from the source region and drain region to the channel forming region to merge them.

The gate length of the memory transistor is shorter than a gate length given by, when the reverse bias voltage is supplied while the gate electrode and the channel forming region are kept at a same potential level, a merged depletion layers extended from the source region and the drain region to the channel forming region.

Each memory transistor comprises a source region contacted to the channel forming region, and a drain region spaced to the source region and contacted to the channel forming region, and the nonvolatile semiconductor memory device comprises a source line commonly connecting the plurality of source regions of the plurality of memory transistors in a bit direction.

A bit line commonly connects the plurality of drain regions of the plurality of memory transistors in the bit direction, and a word line commonly connects the plurality of gate electrodes of the plurality of memory transistors in a word direction.

Each memory transistor comprises a source region contacted to the channel forming region, and a drain region spaced to the source region and contacted to the channel forming region, and the nonvolatile semiconductor memory device comprises sub source lines commonly connecting the plurality of source regions of the plurality of memory transistors in a bit direction. A main source line commonly connects the sub source lines in the bit direction, sub bit lines commonly connect the plurality of drain regions of the plurality of memory transistors in the bit direction, a main bit line commonly connecting the sub bit line in the bit direction, and a word line commonly connects the plurality of gate electrodes of the plurality of memory transistors in a word direction. A selected memory transistor is connected between the sub source line and the main source line and between the sub bit line and the main bit line.

The plurality of memory transistors are connected in series between a first selected transistor connected to a bit line and a second selected transistor connected to a common potential line.

Each memory transistor comprises a source region contacted to the channel forming region, and a drain region spaced to the source region and contacted to the channel forming region. The nonvolatile semiconductor memory device comprises a plurality of element separation regions for isolating the respective memory transistors by insulation, a common line commonly connecting the source regions or the drain regions in a bit direction, and a word line connecting the plurality of gate electrodes in a word direction. The plurality of element separation regions are formed as lines along the bit direction and spaced each other, and the common line which intersects and is electrically isolated to the word line, is connected to one of the source region or the drain region, and is wired on the element separation regions by avoiding a wiring passing on another region of the source region or the drain region which is not connected to the common line.

The plurality of element separation regions are formed as parallel strips having a width approximately equal to that of the word line, adjacent strips being spaced as adjacent word lines, a self-aligned contact hole is formed on the source region and the drain region by using a sidewall insulation layer formed on sidewalls of the word line, and the common line wired on the element separation regions is commonly connected to the one region through the self-aligned contact hole and is wired by a winding manner in the bit direction.

The charge storing means does not have conductivity as a whole facing to the channel forming region when charges are not moved to the outside of the memory transistor.

The gate insulating film comprises a tunneling insulating film formed on the channel forming region, and a nitride film or an oxide nitride film, formed on the tunneling insulating film.

The gate insulating film comprises a tunneling insulating film formed on the channel forming region, and conductors including small sized conductive material, formed on the tunneling insulating film as the charge storing means and isolated from each other.

According to a second aspect of the present invention, there is provided a process of producing the nonvolatile semiconductor memory, including steps of: forming a drain region, a source region and a channel forming region arranged between the drain region and the source region and contacted to them; forming a gate insulating film including a charge storing means formed on and facing the surface of the channel forming region; and forming a gate electrode on the gate insulating film, the gate insulating film formation step including a step of forming a Fowler-Nordheim (FN) type tunneling film comprising material having an FN tunneling electroconductivity and having a dielectric constant larger than that of silicon oxide, and the FN tunneling film forming step including a step of heating the FN tunneling film at a high temperature in an atmosphere of a reduction gas and/or oxidation gas.

The process further includes a step of forming a buffer layer formed between the FN tunneling film and the channel forming region and suppressing an interface trap level, before forming the FN tunneling film.

A process further includes a step of forming a Pool-Frenkel (PF) type film including any one of a nitride film, an oxynitride film, and aluminum oxide film, a tantalum pentaoxide film and a BST (BaSrTiO$_3$) film, having an PF electroconductivity, on the FN tunneling film.

A process of further includes a step of forming a PN film on the FN tunneling film via the buffer layer, the PN film comprising any one of a nitride film, an oxynitride film, an aluminum oxide film, a tantalum pentaoxide film and a BST (BaSrTiO$_3$) film, having a PF electroconductivity.

According to a third aspect of the present invention, there is provided a method of writing data into the nonvolatile semiconductor memory device, including a step of applying a voltage to the pull-up electrode to raise a potential of the gate electrode.

A method includes a step of applying a program voltage equal or lower than 10V, to a gate electrode of the selected memory transistor.

A method includes the steps of: supplying a reverse-biased voltage to the source region and/or the drain region of the memory transistor the gate electrode of which is connected to the word line selected at a writing, through the common line, to make the source region and/or the drain region in a reverse-biased state to the channel forming region, and supplying a voltage to a non-selected word line at the writing, a polarity of the voltage being a polarity making the non-selected word line in a reverse-biased state to the channel forming region.

A method includes a step of supplying the reverse-bias voltage to the source region and/or the drain region to make a bias voltage of the memory transistor connected to the selected word line to thereby prevent an erroneous write and/or an erroneous erase.

A method includes a step of supplying a voltage having a polarity for reverse-biasing to the non-selected word line to make a bias voltage of the memory transistor connected to the non-selected word line to thereby prevent an erroneous write and/or an erroneous erase.

A method includes a step of biasing the gate electrode to the source region so that a voltage of the gate electrode becomes a low level equal or lower than an inhibit gate voltage.

When the reverse bias voltage is supplied to the channel forming region, the gate electrode and the channel forming region of the memory transistor are applied by a same voltage.

The reverse bias voltage is applied to the source region via a source line commonly connecting the source regions in the bit direction, and/or, the drain region via a bit line commonly connecting the drain regions in the bit direction, and the voltage having a polarity for reverse-biasing is applied via the word line commonly connecting the gate electrodes in the word direction.

A program voltage is applied to the gate electrode, and a voltage is applied to the pull-up electrode of the selected memory transistor.

A voltage having a polarity for reverse-biasing is applied to the non-selected word line, the reverse-biasing voltage is applied to the source region and/or the drain region of the memory transistor connected to the selected word line, a program voltage is applied to the selected word line, and a voltage is applied to the pull-up electrode.

BRIEF DESCRIPTION OF THE DRAWINGS

These and other objects and features of the present invention will become more apparent from the following description of the preferred embodiments given with reference to the accompanying drawings, in which.

DESCRIPTION OF THE PREFERRED EMBODIMENTS

First Embodiment

Figure 1:
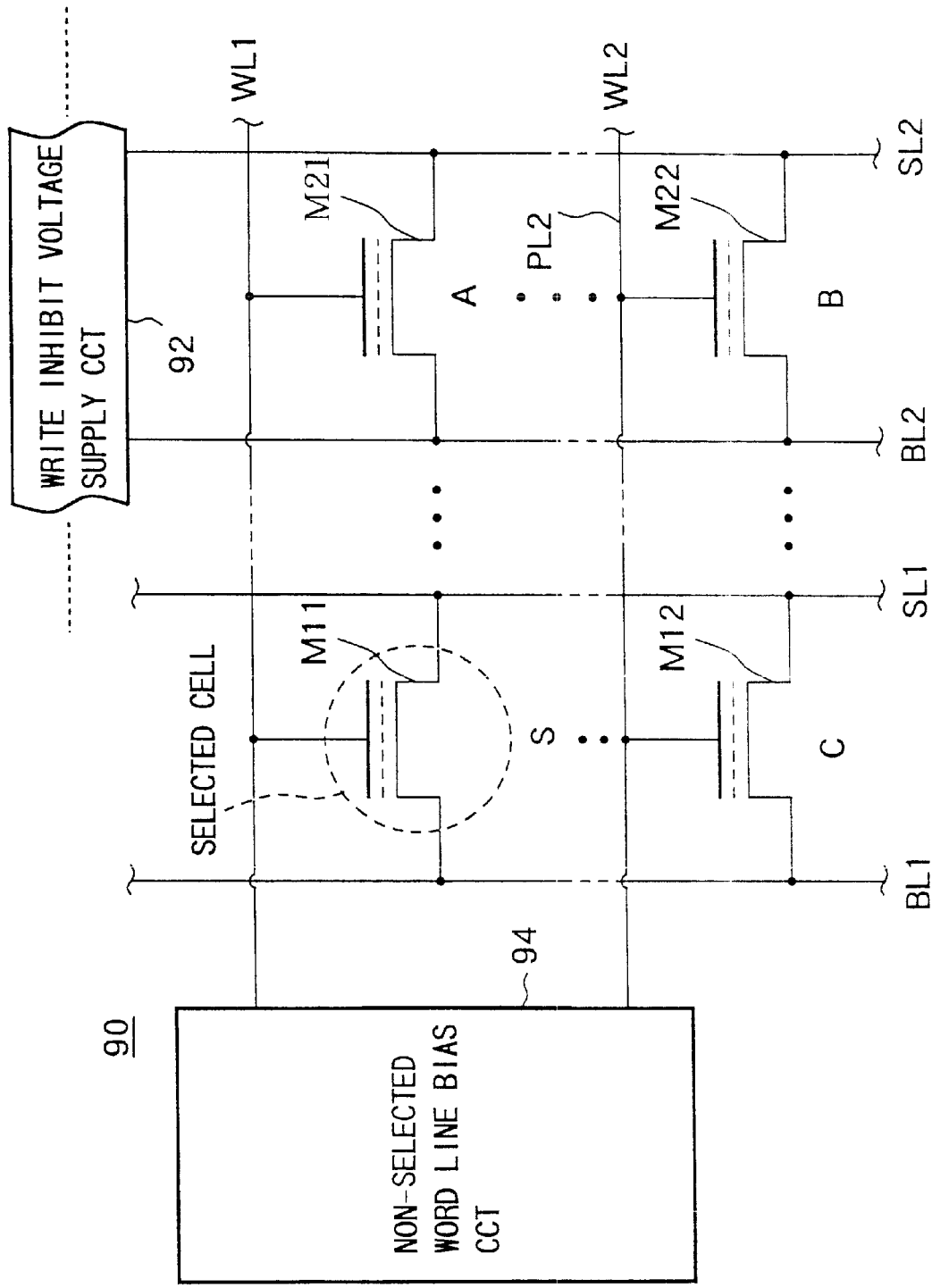
FIG. 1 is a view of the general configuration of a divided source line NOR type nonvolatile semiconductor memory according to a first embodiment of the present invention.

FIG. 1 is a view of the general configuration of a divided source line NOR type nonvolatile semiconductor memory according to a first embodiment of the present invention.

In the nonvolatile semiconductor memory 90 of the first embodiment, each of the memory cells of a NOR type memory cell array is comprised of a single memory transistor. As shown in FIG. 1, the memory transistors M11 to M22 are arranged in an array. Word lines, bit lines, and divided source lines are laid between the adjacent transistors. That is, the drains of the memory transistors M11 and M12 adjoining each other in the bit direction are connected to the bit line BL1, while the sources are connected to the source line SL1. Similarly, the gates of the memory transistors M12 and M22 adjoining each other in the word direction are connected to the word line WL2.

The cell arrangement and the interconnection of cells are repeatedly in this way in the memory cell array as a whole.

Figure 2:
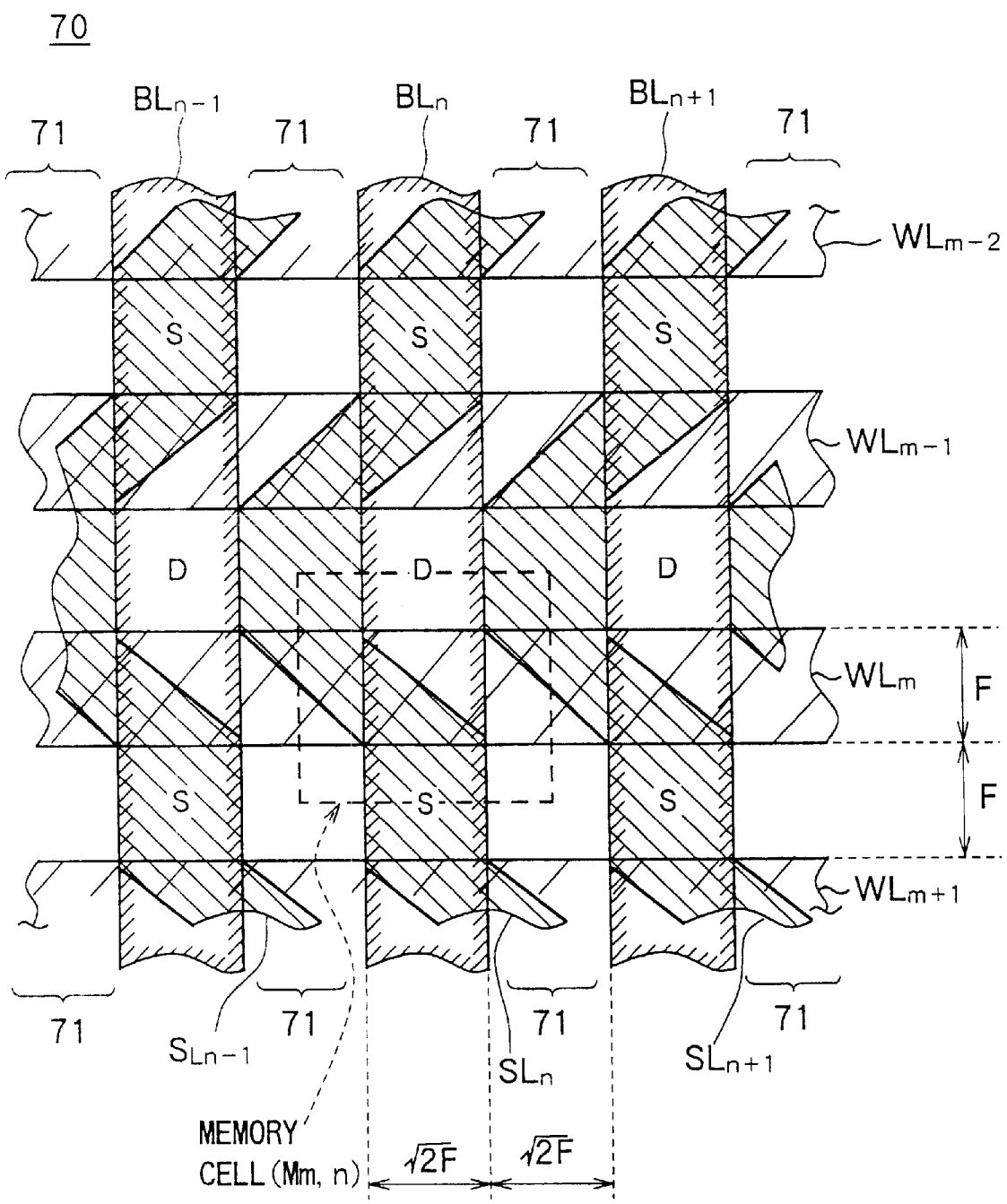
FIG. 2 is a schematic plan view of a fine NOR type memory cell array using self-alignment and serpentine source lines as an example of a specific cell arrangement pattern.

FIG. 2 is a general plan view of a fine NOR type memory cell array using self-alignment and serpentine (meander arranged) source lines as a specific example of the cell arrangement pattern of the first embodiment.

In this fine NOR type memory cell array 70, longitudinal strip trenches or LOCOS or other element separation (isolation) regions 71 are arranged on the surface of a not shown p-well at equal intervals in the bit direction (longitudinal direction of FIG. 2). Word lines $WL_{m-2}$, $WL_{m-1}$, $WL_m$, and $WL_{m+1}$ are arranged at equal intervals substantially perpendicular to the element separation regions 71. Each of the word lines, as explained below, is comprised of a stacked film structure of a tunnel insulating film, nitride film, top insulating film, and gate insulating film. While not particularly illustrated, for example, the same pattern of pull-up lines are arranged on the not shown word lines through a dielectric film.

In the active regions in the intervals between the element separation regions, for example, an n-type impurity is doped at a high concentration to alternately form source regions and drain regions in the intervals between the word lines. These source regions and drain regions are defined in size in the word direction (lateral direction of FIG. 2) only by the intervals between the trenches or LOCOS or other element separation regions 71 and are defined in the bit direction only by the intervals between the word lines. Therefore, the source regions and drain regions can be formed extremely uniformly in size and arrangement since almost no mask alignment error is introduced.

Around the word lines, by just forming side walls, contact holes for connecting bit lines and contact holes for connecting source lines are formed with respect to the source regions and drain regions by simultaneously applying two self-aligned contact forming steps. Further, the above process does not require a photomask. Therefore, as explained above, not only the source regions and drain regions are uniform in size and arrangement, but also the contact holes for connection of the bit lines or source lines formed by self-alignment two-dimensionally become extremely uniform in size as well. Further, the contact holes have substantially the maximum extent of size with respect to the area of the source regions and drain regions.

The source lines $SL_{n-1}$, $SL_n$, and $SL_{n+1}$ arranged in the bit direction are arranged in a serpentine (meander) fashion on the element separation regions 71 and source regions while avoiding the drain regions and are connected to the lower layer source regions through the contact holes for connection of the source lines. The bit lines $BL_{n-1}$, $BL_n$, and $BL_{n+1}$ are arranged on the source lines through a second interlayer insulating film at equal intervals. The bit lines are positioned above the active regions and are connected through the contact holes for connection of the bit lines to the lower layer drain regions.

In such a configuration of a cell pattern, as explained above, since the source regions and drain regions can be formed without being affected much by mask alignment or since the contact holes for bit line connection and contact holes for source line connection are formed by applying two self-alignment steps, the contact holes do not act as elements restricting the reduction of the cell area, it is possible to arrange sources at the minimum line width F of the limit of the wafer process, and there is almost no wasted space, so it is possible to realize an extremely small cell area close to $6F^2$.

Figure 3:
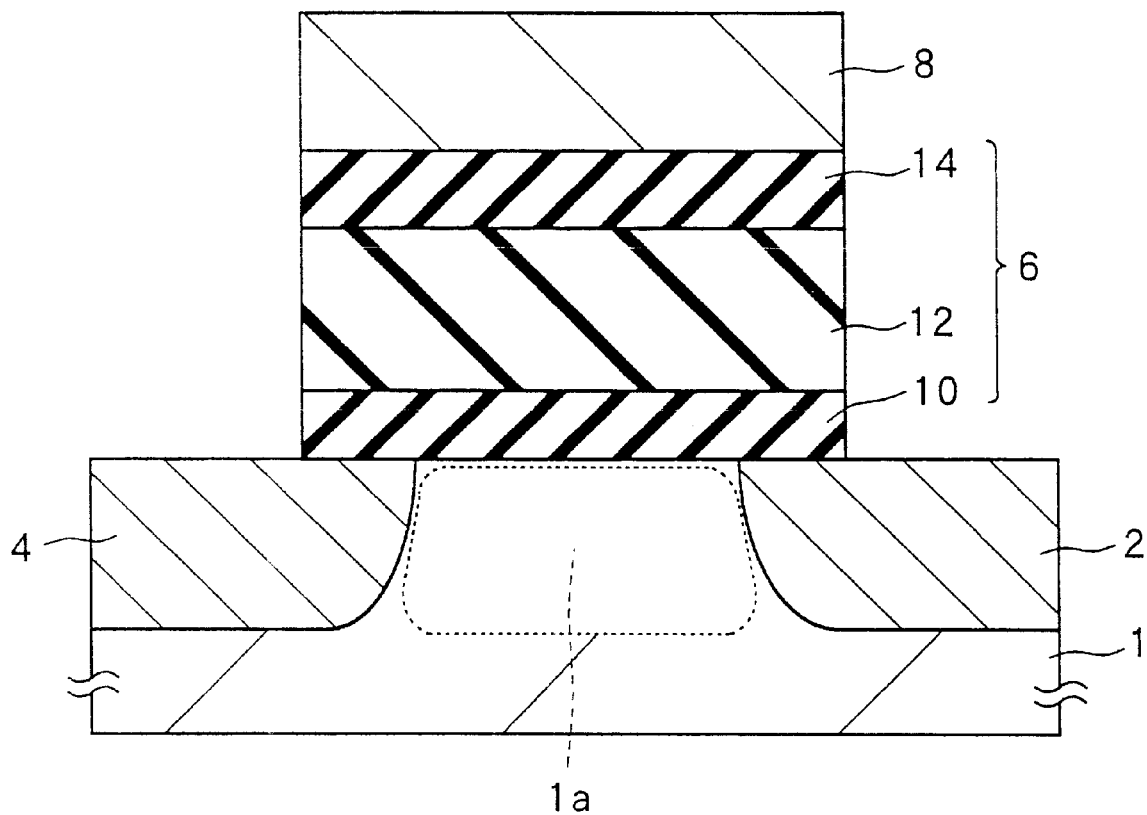
FIG. 3 is a sectional view of the element structure of a MONOS type memory transistor according to the first embodiment of the present invention.

FIG. 3 is a sectional view of the element structure of a MONOS type memory transistor according to the first embodiment.

In FIG. 3, reference numeral 1 represents a silicon wafer or other semiconductor substrate having an n-type or p-type conductivity, 1a represents a channel forming region, and 2 and 4 represent the source region and drain region of the memory transistor.

In the present specification, the "channel forming region" means the region where a channel is formed for conduction of electrons or positive holes inside the surface side. The "channel forming region" in the first embodiment corresponds to the portion sandwiched between the source region 2 and the drain region 4 inside the semiconductor substrate.

The source region 2 and the drain region 4 are regions of a high conductivity formed by doping an impurity of an opposite (inversed) conductivity to the channel forming region 1a at a high concentration in the semiconductor substrate 1. There are various forms of this. Normally, it is often possible to provide a low concentration impurity region called a "lightly doped drain (LDD)" region at positions of the substrate where the source region 2 and the drain region 4 are close to the channel forming region 1a.

On the channel forming region 1a is stacked a gate electrode 8 of the memory transistor through a gate insulating film 6. The gate electrode 8 generally is comprised of polycrystalline silicon made conductive by doping with a p-type impurity or an n-type impurity at a high concentration (doped poly-Si) or a stacked film of doped poly-Si and a high melting point metal silicide.

The gate insulating film 6 of the first embodiment is comprised, in order from the bottom layer, of a tunnel insulating film 10, nitride film 12, and top insulating film 14.

The tunnel insulating film 10 is a nitride film having Fowler-Nordheim (FN) tunneling electroconductivity (FN tunnel nitride film). This FN tunnel nitride film is a silicon nitride film fabricated by for example a jet vapor deposition (JVD) method or a method of heating and changing the chemical vapor deposition (CVD) film in an atmosphere condition of a reducing or oxidizing gas (hereinafter referred to as the heat FN tunneling method) or a film comprised mainly of silicon nitride (for example, a silicon oxynitride film).

While a silicon nitride film fabricated by normal CVD exhibits a Pool-Frenkel type (PF type) electroconductivity, an FN tunnel nitride film exhibits an FN type electroconductivity since the carrier trap effect in the film is reduced compared with a nitride film fabricated by normal CVD. Therefore, the electrons are conducted through the tunnel insulating film 10 in a write operation using demodified FN tunneling.

The thickness of the tunnel insulating film (FN tunnel nitride film) 10 can be set in the range of 2.0 nm to 5.0 nm in accordance with the application of the nonvolatile semiconductor memory. Here, it is set to 3.0 nm.

The nitride film 12 is comprised of a silicon nitride ($Si_xN_y$ (0<x<1, 0<y<1)) film of 3.0 nm. This nitride film is fabricated for example by low pressure CVD (LP-CVD). A large amount of carrier traps are included in the film. The nitride film 12 exhibits a PF type electroconductivity. Therefore, the nitride film 12 has a completely different quality and mechanism (phenomenon) of electroconduction from the lower layer tunnel insulating film 10.

The top insulating film 14 is formed by heat oxidizing the nitride film after its formation since it is necessary to form deep carrier traps at a high density near the boundary (interface) with the nitride film 12. When the top insulating film 14 is formed by CVD, the traps are formed by heat treatment. The thickness of the top insulating film 14 must at the minimum be 3.0 nm, preferably 3.5 nm, in order to effectively prevent holes from being injected from the gate electrode 8 and prevent a reduction in the data write life.

Next, an example of the process of production of a memory transistor of such a configuration will be explained briefly focusing on the process for forming a gate insulating film.

First, explaining the basic general flow of the process of production, element separation regions are formed on a prepared semiconductor substrate 1, a well is formed, ions are injected for adjustment of the threshold voltage if necessary, then a stacked pattern of the gate insulating film 6 and gate electrode 8 is formed on an active region of the semiconductor substrate 1, the interlayer insulating film is formed, contact holes are formed, source and drain electrodes are formed, and if necessary upper layer interconnections are formed over the interlayer insulating film, an overcoat is formed, and pads are opened so as to complete the nonvolatile memory transistor.

In the step for formation of the gate insulating film 6, first the JVD method or heat FN tunneling method is used to form the FN tunnel nitride film 10 to for example about 3 nm.

In the JVD method, Si and N molecules or atoms are discharged from a nozzle into a vacuum at an extremely high speed, the high speed flow of the molecules or atoms is guided onto the silicon substrate, and for example a silicon oxynitride film is deposited.

In the heat FN tunneling method, first, as processing before fabrication of the FN tunnel nitride film 10, the semiconductor substrate 1 is heated for example in an NO atmosphere at 800° C. for 20 seconds or so. Next, for example, LP-CVD is used to deposit a silicon nitride (SiN) film. Next, the CVD film is heat treated in, for example, an ammonia ($NH_3$) gas atmosphere at 950° C. for 30 to 60 seconds, then heat treated in an N2O gas atmosphere at 800 to 850° C. for 30 seconds to 1 minute to change the SiN film, which had been a PF film exhibiting PF conductivity directly before formation of the film by CVD, to an FN tunnel film.

On the FN tunnel nitride film 10 fabricated in this way is thickly deposited a nitride film 12 by LP-CVD to give a final thickness of 3.0 nm. This CVD is, for example, performed using a gas comprised of a mixture of dichlorosilane (DCS) and ammonia at a substrate temperature of 650° C. Here, if necessary, an increase in the roughness of the finished film surface may be suppressed by optimizing the pretreatment of the underlying surface (wafer pretreatment) and film forming conditions. In this case, if the wafer pretreatment is not optimized, the surface morphology of the silicon nitride film will be poor and accurate measurement of thickness will not be possible, so the wafer pretreatment may be sufficiently optimized, then the thickness of the film set in consideration of the loss of the silicon nitride film in the next heat oxidation step.

The nitride film 12 formed has many carrier traps and exhibits a PF electroconductivity.

The surface of the nitride film 12 formed is for, example, oxidized by heat oxidation to form a top insulating film 14 to a thickness of 3.5 nm or so. This heat oxidation is, for example, performed in an H2O atmosphere at a furnace temperature of 950° C. As a result, deep carrier traps with a trap level (energy difference from conduction band of silicon nitride) of not more than 2.0 eV or so are formed at a density of about 1 to $2 \times 10^{13}$ cm−2. Further, a heat oxidized silicon film (top insulating film 14) is formed to a thickness of 1.6 nm with respect to a nitride film 12 of 1 nm. The thickness of the underlying nitride film is reduced by this rate. The final thickness of the nitride film 12 becomes 3 nm.

After the gate insulating film 6 is formed in this way, the film forming the gate electrode 8 is formed and the conductive film for forming the gate electrode 8 and the gate insulating film 6 are continuously etched by, for example, reactive ion etching (RIE). This completes the patterning of the gate electrodes, then the above steps are gone through to complete the nonvolatile memory transistor.

When forming the tunnel oxide film in the ONO film of the MONOS type nonvolatile memory transistor (tunnel oxide film/nitride film/top oxide film) to a thickness of for example 3 nm or so, typical values of the specification of the thickness of the ONO film up to now have been 3.0/5.0/3.5 nm. The ONO film has a thickness of 9 nm converted to values of a silicon oxide film.

On the other hand, the MONOS type nonvolatile memory transistor according to the first embodiment has the advantage that it is possible to form the intermediate nitride film 12 thinner by using an FN tunnel nitride film for the tunnel insulating film 10. That is, the thickness specifications of the gate insulating film 6 can be made for example an FN tunnel nitride film of 3.0 nm, a nitride film of 3.0 nm, and a top oxide film of 3.5 nm. In this case, since the dielectric constant of silicon nitride is about two times that of silicon oxide, the value estimated to that of silicon oxide becomes 6.5 nm, that is, this means the reduction of 30% to the earlier device. This is believed to be because if an FN tunnel nitride film is used for the tunnel insulating film 10, the number of carrier traps in the tunnel insulating film 10 and at the boundary (interface) between the tunnel insulating film 10 and nitride film 12 sharply falls, so deep carrier traps formed near the boundary (interface) between the nitride film 12 and the top insulating film 14 are used for storing charges more efficiently than in the past.

In this way, in the first embodiment, the tunnel insulating film 10, which had generally been 1.6 nm to 2.0 nm or so in thickness in the past, is set relatively thick to improve the disturbance characteristic and an FN tunnel insulating film is used for the tunnel insulating film 10 so as to reduce the effective thickness of the gate insulating film 6 and, as a result, enable an increase of the thickness of the tunnel insulating film and reduction of the operating voltage.

Further, there is also the method of forming a top insulating film by directly heat oxidizing the FN tunnel nitride film, a concept different from the method of formation of a transistor illustrated in FIG. 3. The structure of this modification is shown in FIG. 4.

Figure 4:
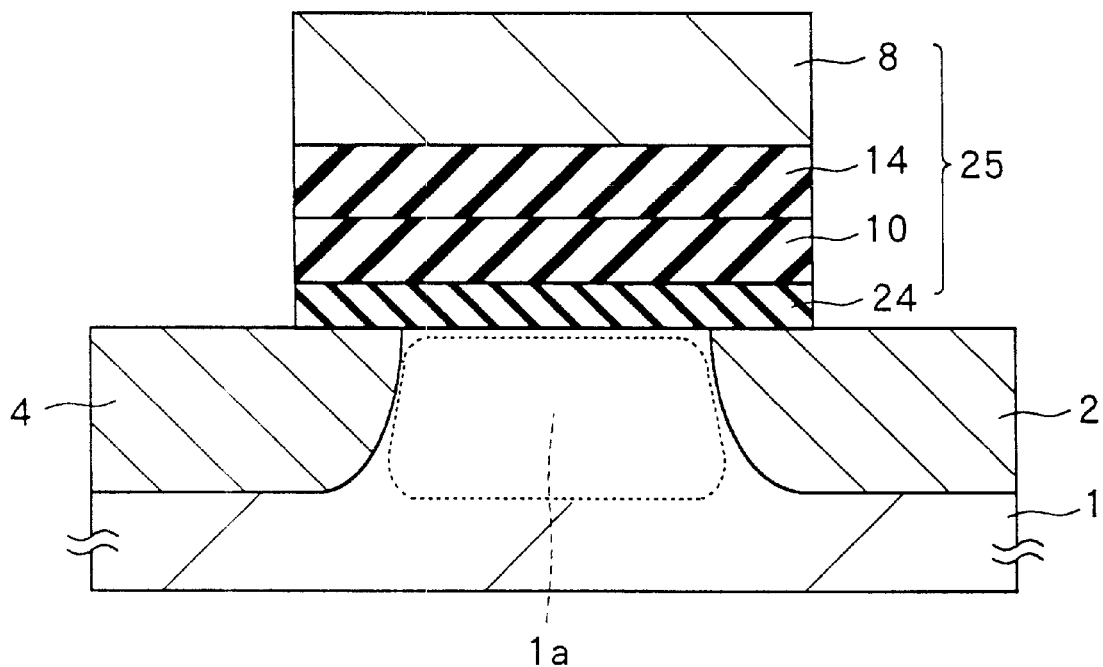
FIG. 4 is a sectional view of another element structure of a MONOS type memory transistor according to the first embodiment of the present invention.

In the nonvolatile memory transistor shown in FIG. 4, a gate insulating film 25 comprises a buffer layer 24, an FN tunnel nitride film 10 and a top insulating film 14, but does not have the nitride film 12 deposited by LP-CVD and exhibiting a PF electroconductivity. The top insulating film 14 is directly formed on the FN tunnel nitride film 10. The buffer layer 24 is a thin PF film formed by heat nitridation of the substrate surface and acts to suppress the generation of the boundary (interfacial) energy level at the substrate surface. The buffer layer 24 eases the strain on the FN tunnel nitride film 10 and therefore there is no increase in the number of carrier traps of the FN tunnel nitride film 10 due to the strain.

The FN tunnel nitride film 10 has a relatively low density of carrier traps in the film compared with a PF film, so the carrier traps formed at the boundary (interface) with the top insulating film 14 are mainly responsible for holding the charges. When the number of carrier traps for holding charges is sufficient, it is possible to make the thickness of the PF film, reduced in thickness down to 3 nm in the above embodiment, 0, that is, to eliminate it.

The nonvolatile memory transistor shown in FIG. 4 can operate with a further lower voltage compared with FIG. 3 by just eliminating the PF film (nitride film 12 or oxynitride film 22).

In the first embodiment, as the means for further improving the disturbance characteristic, as shown in FIG. 1, provision is made of a write inhibit voltage supply circuit 92 which is connected to common lines in the bit direction and supplies a reverse bias voltage to the source regions 2 and/or drain regions 4 of nonselected memory transistors and a nonselected word line bias circuit 94 which is connected to the word lines and supplies a voltage giving a reverse bias from the channel forming regions 1a to the gate electrodes 8 of nonselected cells.

Here, a "common line" means a line which commonly and directly connects or capacity-couples the source regions or drain regions of a plurality of memory transistors in the bit direction (column direction) and may be, for example, a bit line or source line and also a so-called booster plate and so forth. FIG. 1 shows the case of the nonvolatile semiconductor memory where the common lines are bit lines and source lines.

Further, a "reverse bias voltage" means a voltage of a direction reversely biasing the pn junction formed between a source or drain region and the semiconductor substrate formed with a channel forming region or bulk region of the semiconductor layer.

Further, the "polarity giving a reverse bias to the channel forming region" means the plus polarity side or minus side direction of the supply of voltage based on the potential of the channel forming region. Specifically the direction when the conductivity type of the channel forming region is the p-type is the plus polarity side while the direction when it is the n-type is the minus polarity side.

The write inhibit voltage supply circuit 92 and the nonselected word line bias voltage 94 supply predetermined voltages to the gate electrodes 8 and the source regions 2 and drain regions 4 of the nonselected memory transistors before the programming of the selected cell so as to prevent mistaken writing or mistaken erasure of the nonselected cells A and B of FIG. 1 and greatly improve the program disturbance margin.

Next, an explanation will be given of a write operation of a nonvolatile memory of this configuration.

Here, as shown in FIG. 1, the nonselected cells A to C are defined by the connection relationship with the selected cell S. That is, the nonselected cell connected to the same selected word line WL1 as the selected cell S is defined as A, the nonselected cell connected to the nonselected word line WL2 and connected to the same selected source line SL1 and selected bit line BL1 as the selected cell S is defined as C, and the nonselected cell connected to the selected word line WL2 and connected to the nonselected source line SL2 and nonselected bit line BL2 is defined as B.

Figure 5:
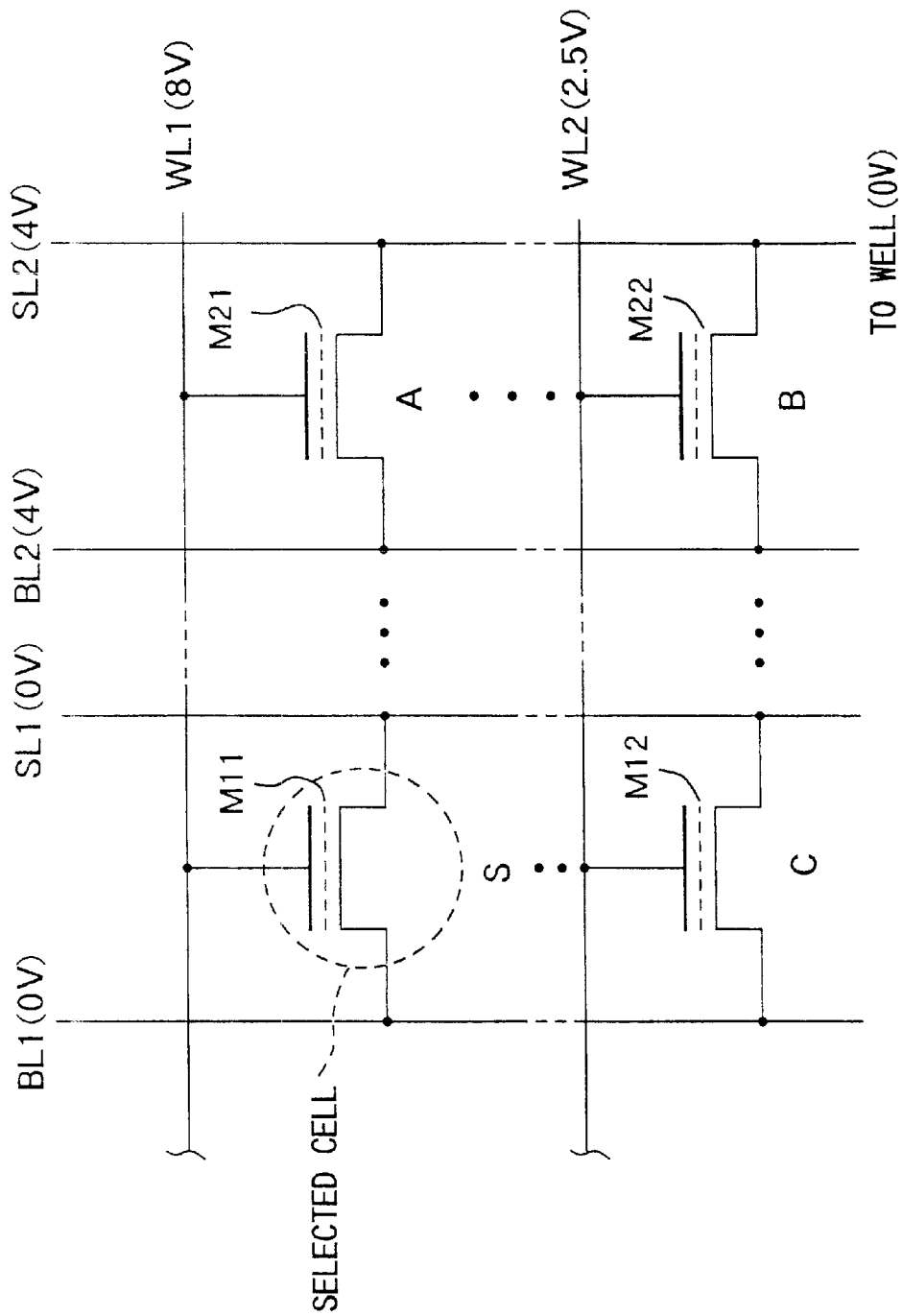
FIG. 5 is a view of a first example of the conditions for setting a write bias voltage according to the first embodiment.

FIG. 5 shows a first example of the conditions for setting the write bias voltage for these four types of cells.

When writing data in the selected cell S, first, the nonselected word line bias circuit 94 is used to supply a predetermined voltage, for example, 2.5V, to the nonselected word line WL2 when the substrate potential is 0V. Further, the write inhibit voltage supply circuit 92 is used to supply a predetermined reverse bias voltage, for example, 4V, to the nonselected source line SL2 and the nonselected bit line BL2 when the substrate potential is 0V. At this time, the selected source line SL1 and the selected bit line BL1 maintain the ground potential 0V.

In this state, a program voltage, for example, 7V, is supplied to the word line WL1 to which the selected cell S is connected. As a result, the potential of the gate electrode of the memory transistor M11 constituting the selected cell S rises to about 8V.

Figure 6:
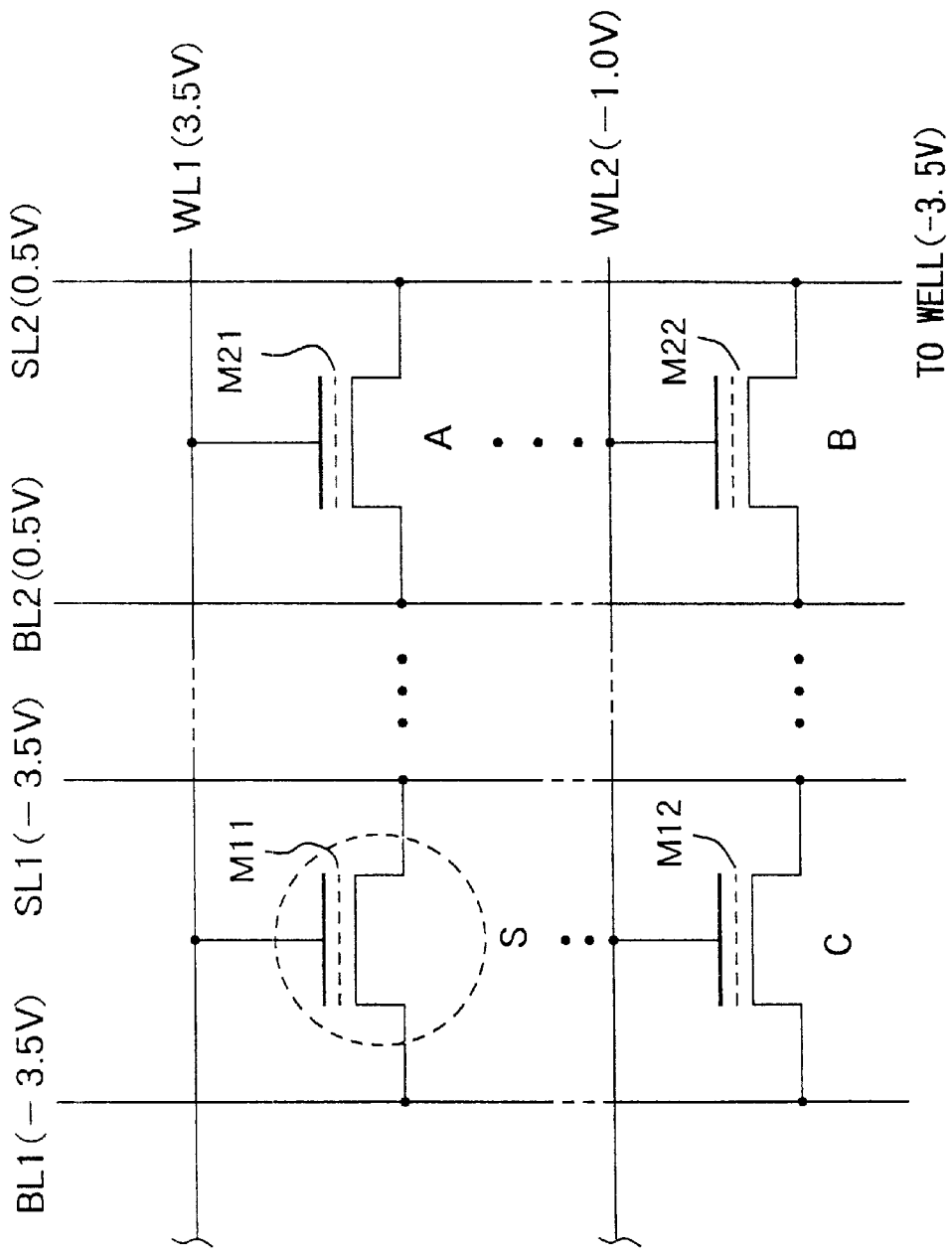
FIG. 6 is a view of a second example of the conditions for setting a write bias voltage according to the first embodiment.

FIG. 6 shows a second example of the conditions for setting the bias voltage.

In the second example of the conditions for setting the bias voltage, a negative voltage is supplied to the well to reduce the gate supply voltage while keeping the same electrical field applied to the gate insulating film as the above case.

In the above FIG. 5, the well voltage was made 0V, but in FIG. 6, the voltage supplied to the well is made a negative voltage, for example, −3.5V. Therefore, it is possible to reduce the voltage supplied to the gate electrode (selected word line WL1) from 7V to 3.5V. Note that along with the halving of the voltage supplied to the selected word line WL1, the voltage supplied to the selected bit line BL1 and the selected source line SL1 is reduced to −3.5V the same as the well, the voltage supplied to the nonselected bit line BL2 and nonselected source line SL2 for prevention of disturbance is reduced to 0.5V, and the voltage supplied to the nonselected word line WL2 is reduced to −1.0V.

Due to the above, by supplying a negative voltage to the well, it becomes possible to supply an operating voltage at the time of a write operation from a polarity (plus/minus) power source with a low absolute voltage of 3.5V.

Figure 7:
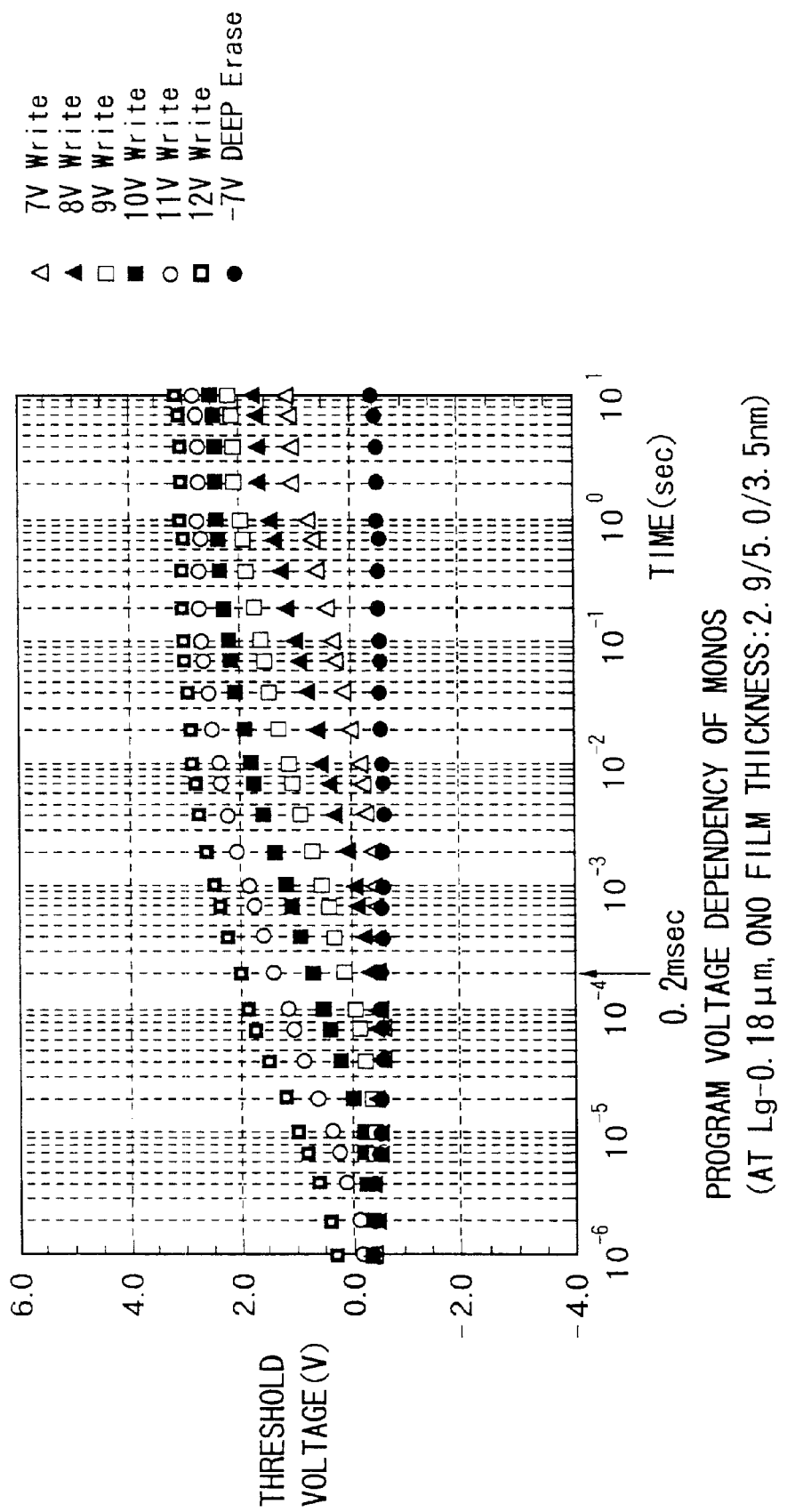
FIG. 7 is a graph of the write/erase characteristic of a nonvolatile memory transistor.

FIG. 7 is a graph of a write/erase characteristic of a nonvolatile memory transistor in the case of using a silicon oxide film for the tunnel insulating film.

In FIG. 7, if the write end threshold voltage Vth is defined as 2V, the write time becomes 0.2 msec at a word line supply voltage 12V and about 20 msec at a word line supply voltage 10V. The write operation does not end even after 10 sec at a word line supply voltage of 7V.

In the write operation of the present embodiment, however, even if the word line potential is 7V, as explained above, the great reduction in the value, estimated (converted) to a silicon oxide film, of the gate insulating film 6 due to the use of an FN nitride film for the tunnel insulating film 10 differs from the case of FIG. 7. Therefore, in the write operation of this embodiment, the word line supply voltage 7V corresponds to a word line supply voltage of the related art of 11 to 11.5V if the tunnel electric field in the FN nitride film is made 10 to 12 MV/cm.

Therefore, in the write operation of the present embodiment, from FIG. 7, it is understood that a high speed write operation of 1 to 2 msec is realized at a word line supply voltage of 7V. That is, a charge passes through the FN tunnel nitride film for FN tunneling to the charge storing means (carrier traps) of the memory transistor M11 of the selected cell S at a word line supply voltage 7V from the entire surface of the channel forming region 1a of the semiconductor substrate 1. The threshold voltage Vth thereby changes and thus the data is written.

In this way, in the first embodiment, it is possible to reduce the write voltage from the 11V to 12V of the related art to 7V while maintaining the same write speed.

In addition, due to similar reasons, in the first embodiment, it is possible to reduce the absolute value of the word line supply voltage (erase voltage) enabling erasure of data from the related art at the same speed as in the related art. That is, it is possible to reduce the erase voltage from the −7V or so of the related art to −5V. In this case, in the first embodiment, since the gate insulating film is effectively thinner than the related art, the erase speed is greatly improved even if supplying the same erase voltage.

In this write method, by supplying for example a positive voltage to the nonselected word line WL2, the disturbance margin of the nonselected cell B is increased and therefore the nonselected cell B is not mistakenly written or mistakenly erased.

Further, by supplying a reverse bias voltage to the nonselected bit line BL2 and the nonselected source line SL2, it is possible to prevent the nonselected cell A from becoming written in by the supply of the program voltage of the selected word line WL1 and the nonselected cell B is not mistakenly written in (or mistakenly erased). If the order of supply of the bias voltage at this time is, as explained above, supply of voltage to the nonselected word line, supply of reverse bias voltage, and supply of programming voltage, the nonselected cell B becomes resistant to disturbance.

Further, the reduction of the voltage supplied to the selected word line WL in the first embodiment from for example 12V to 7V or so also has the effect of being advantageous in prevention of disturbance at the nonselected cells A and B.

The above explanation related to prevention of disturbance, but it is also necessary to investigate if there is any problem in withstand voltage (junction withstand voltage) at the time of making the source and drain a reverse bias and confirm the main disturbance characteristic.

[Tolerance Voltage of Memory Transistor]

A study was made of the current-voltage characteristic in the case of a gate voltage of 0V in both the cases of the write state and erase state.

As a result, it was understood that a yield voltage of the junction did not depend on the write state and erase state. It was understood however that the rising voltage at the sub breakdown region near 3V to 5V differs in the write state and erase state.

A study was made of the dependency of the current-voltage characteristic on the gate voltage in the write state. The yield voltage does not exhibit any dependency on the gate voltage, but the rising voltage at the sub breakdown region exhibits dependency on the gate voltage. The sub breakdown region is believed to be due to the interband tunnel phenomenon at the surface of the drain/source region of the gate edge portion, but since the current level is small, it is believed not to be a problem here. Further, since even with a yield voltage of about 10V, the upper limit of the source-drain supply voltage (inhibit S/D voltage) is about 7V or giving a sufficient margin, it is believed that there is no direct effect on the inhibit characteristic.

Due to the above, it was understood that in a 0.18 $\mu$m MONOS type memory transistor, the junction withstand (tolerance) voltage would not become a factor restricting the program disturbance characteristic.

[Main Device Characteristic]

The current-voltage characteristic in the write state and erase state was studied.

When the gate voltage is 0V, the current of a nonselected cell at a drain voltage of 1.5V is about 1 $\mu$A. Since the read current in this case is at least 10$\mu$A, it is believed that no mistaken reading of a nonselected cell will occur. Therefore, it was understood that there was a sufficient margin of the punchthrough tolerance (withstand) voltage at the time of a read operation in a MONOS type memory transistor with a gate length of 0.18 $\mu$m. Further, the read disturbance characteristic at a gate voltage of 1.5V was also evaluated, but a read time of at least $3 \times 10^8$ sec becomes possible.

The data write characteristic under write conditions (program voltage=7V, program time=1 msec) and under erase conditions (erase gate voltage=−5V, erase time=100 msec) was studied. It was understood that the number of data write life is a good $1 \times 10^6$ times since the carrier traps are spatially dispersed. Further, the data retention (charge holding) characteristics were 85° C. and 10 years after $1 \times 10^6$ data rewrites.

Due to the above, it could be confirmed that a sufficient characteristic was obtained as a 0.18 $\mu$m generation MONOS type nonvolatile memory transistor.

In the first embodiment, by using an FN tunnel nitride film for the tunnel insulating film, it is possible to provide the word line supply voltage (program voltage and erase voltage) at a voltage level greatly reduced from the related art and as a result possible to simplify the configuration of the operating voltage generating circuit.

Further, the FN tunnel nitride film is reduced in the leakage current accompanying the formation of defects (SILC) after data rewrites compared with an oxide film, so the repeatability of the write/erase operations, that is, the endurance characteristic, is improved. The endurance characteristic is already improved since the tunnel insulating film is relatively thick. The reason is that the injection of holes to the charge storing means is suppressed by the relatively thick tunnel insulating film and, as a result, the deterioration of the tunnel insulating film due to holes is suppressed.

Further, the data retention (charge holding) characteristics after data rewrites, the disturbance characteristic, and other facets of its reliability are improved.

In particular, in the first embodiment, the fact that by supplying for example a positive bias voltage to a nonselected word line, it is possible to raise the upper limit of the inhibit S (source)/D (drain) voltage of the nonselected cell B connected to both a nonselected word line and a nonselected bit line and increase the program disturbance margin could be experimentally confirmed in a 0.18 µm generation MONOS type nonvolatile memory. The dependency of this effect on the gate length was investigated. As a result, it was found the effect was particularly remarkable in a region with a gate length shorter than 0.2 µm. The effect of improvement is due to the fact that in the case of the related art where the gate voltage is 0V, the channel forming region becomes depleted due to the reverse bias voltage, the field component increases in the direction draining the held charge in the ONO film to the substrate side in the channel forming region of the transistor, and the gate voltage is reduced due to the application of a voltage biasing this in the reverse bias direction (positive direction in the first embodiment). It was understood that raising the upper limit of the inhibit S/D voltage increases the program disturbance margin of the nonselected cell A connected to the same nonselected bit line. Further, the junction withstand voltage of the transistor was studied by experiments. As a result, it was understood that the junction withstand voltage of the transistor was larger than the inhibit S/D voltage and did not become a factor restricting the program inhibit characteristic. It was also confirmed that there was no effect on the main device characteristics. The data showing the increase of the program disturbance margin can be applied due to its principle to a MONOS type memory transistor of the 0.18 µm generation and on as well.

Increasing the program disturbance margin facilitates the realization of a single transistor cell, that is, a memory cell using a single transistor. To realize this, it is not only necessary to increase the disturbance margin, but also necessary to obtain an enhancement type memory cell which does not deplete the threshold voltage of the memory transistor. By giving a greater margin to the program voltage, it is possible to increase the thickness of the tunnel film assuming the same program speed. Due to this, in the erase characteristics, the threshold voltage is hard to deplete, a memory characteristic is obtained which is saturated at enhancement, and a single transistor cell becomes easier to realize in this respect as well.

In a single transistor cell, there is no need to provide a selected transistor for each memory cell, so the cell area is reduced and in turn the chip area is reduced resulting in reduced costs and larger capacity. As a result, it becomes possible to realize, at a low cost, a large capacity MONOS type nonvolatile memory with a cell area equal to that of a NOR type, AND type, NAND type, DINOR type, or other FG type nonvolatile memory.

Note that the write inhibit voltage supply circuit in this example can be used for effective enhancement operation by reading information in a state with the source region reversely biased.

Due to the above, in the first embodiment, it becomes possible to easily realize a single transistor cell operating with a low voltage.

Second Embodiment

Figure 8:
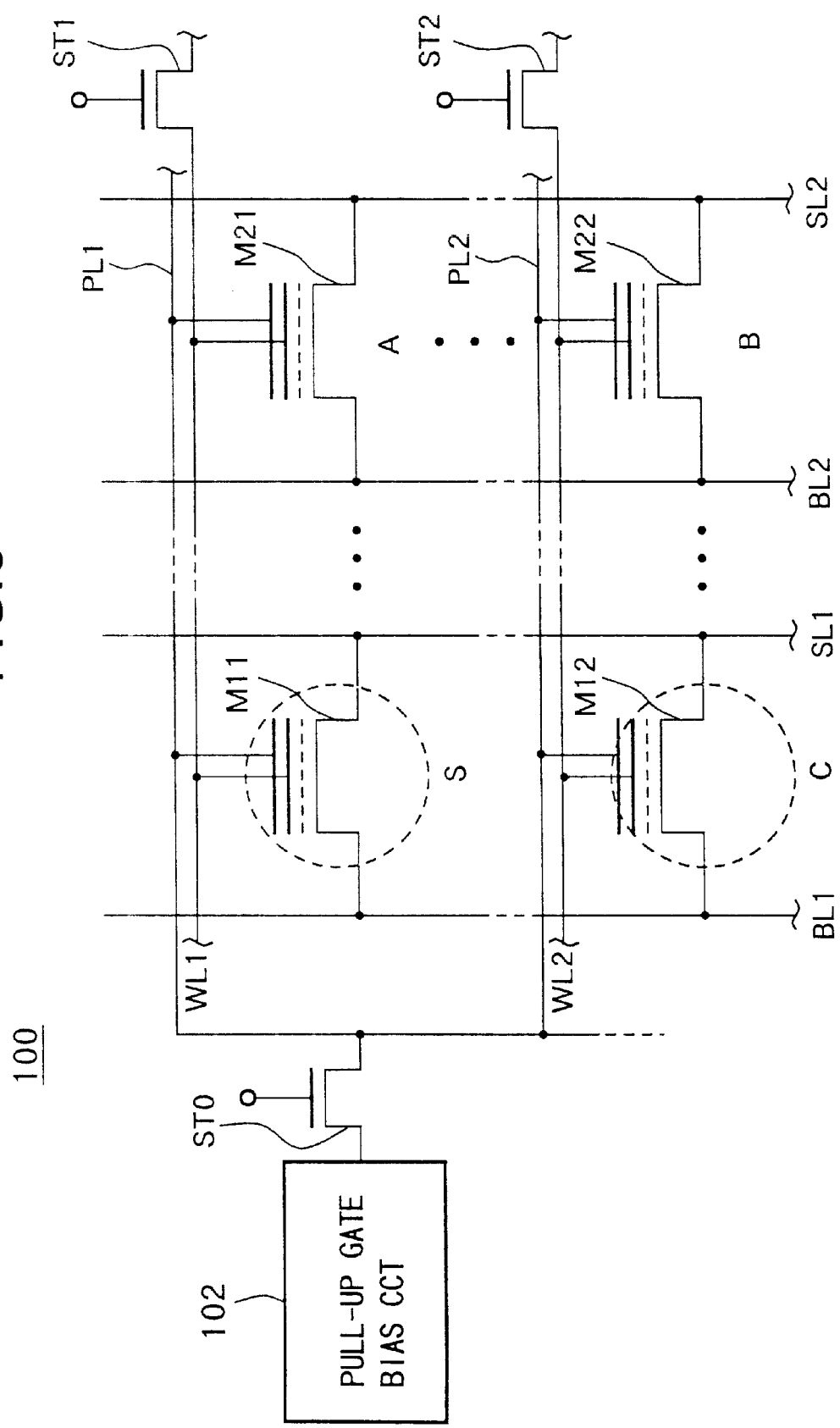
FIG. 8 is a view of the schematic configuration of a nonvolatile semiconductor memory according to a second embodiment of the present invention.

FIG. 8 is a view of the general configuration of a nonvolatile semiconductor memory according to a second embodiment of the present invention.

The nonvolatile memory device 100 of the second embodiment is the same as that of the first embodiment in that each memory cell is comprised of a divided source line NOR type single transistor cell and that suitable use can be made of a fine NOR type memory cell array pattern with meandering source lines (FIG. 2) and in the connection relationship of the word lines, bit lines, and divided source lines to the memory cells.

In the second embodiment, while details will be explained later, a pull-up electrode is provided through a dielectric film on the gate electrode of each memory transistor.

The pull-up electrodes of the memory transistors are for example connected in common to pull-up lines arranged in the word direction.

The pull-up electrodes of the memory transistors M11 and M21 adjoining each other in the word direction are connected to a pull-up line PL1. Similarly, the pull-up electrodes of the memory transistors M12 and M22 adjoining each other in the word direction are connected to a pull-up line PL2.

The pull-up lines PL1, PL2, . . . . have a pull-up gate bias circuit 102 connected to them through a common selected transistor ST0. The pull-up gate bias circuit 102 is a circuit for raising a word line to a predetermined potential at the time of a write operation. Due to this, it is possible to reduce the write voltage supplied in advance to the word line selected at the time of the write operation (hereinafter also referred to as the program voltage or precharge voltage).

Under this control, it is necessary to make the word line float in potential after supply of the program voltage. Therefore, the word lines WL1, WL2, . . . are connected to a not shown word line selection circuit (row decoder) through the selected transistors ST1, ST2, . . .

Figure 9:
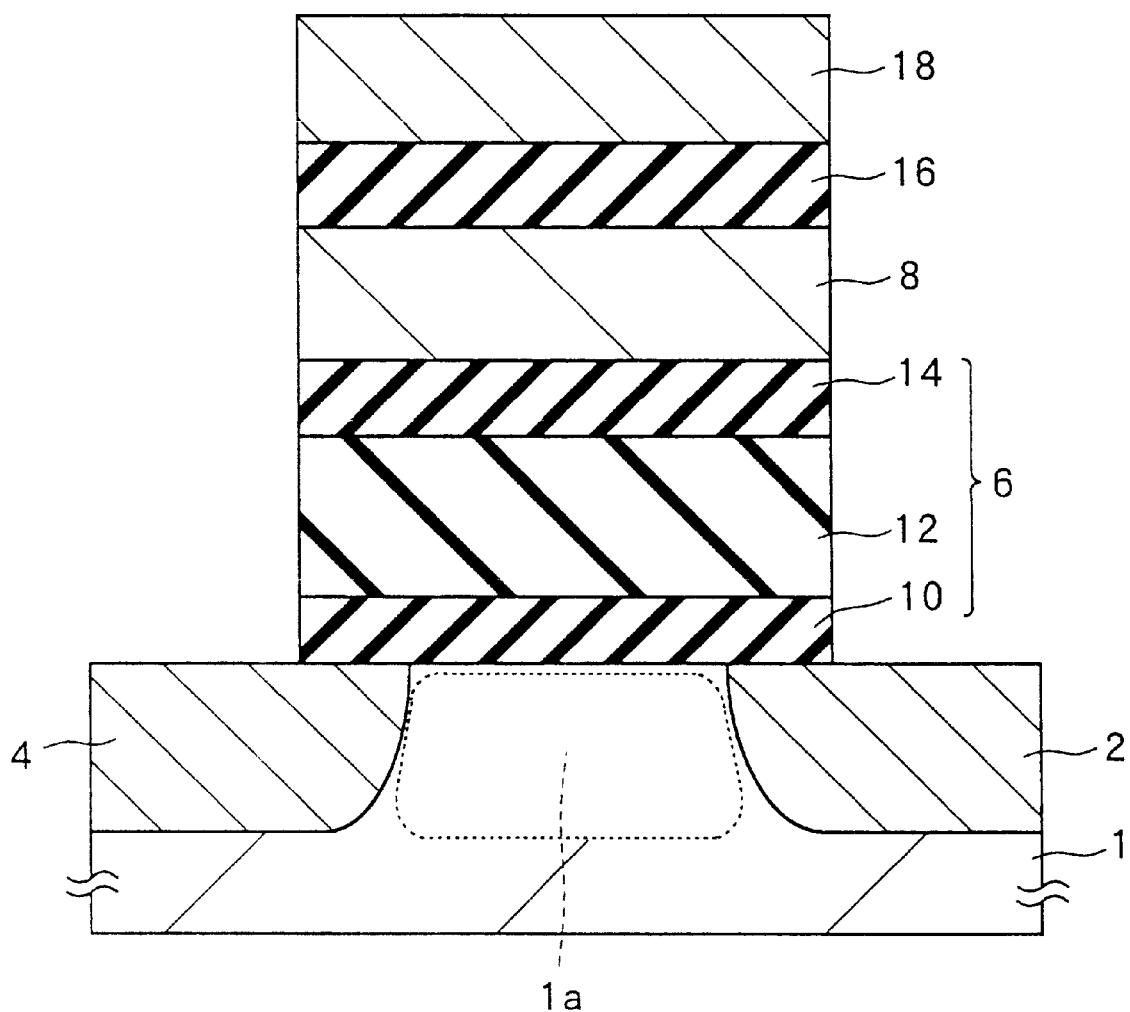
FIG. 9 is a sectional view of the element structure of a MONOS type memory transistor according to the second embodiment.

FIG. 9 is a sectional view of the element structure of a MONOS type memory transistor according to the second embodiment.

The MONOS type nonvolatile memory transistor of the second embodiment is, like the first embodiment, provided with a semiconductor substrate 1, a source region 2, a drain region 4, a gate insulating film 6 comprising a tunnel insulating film (FN tunnel nitride film) 10, a nitride film 12 and a top insulating film 14, a channel forming region 1a, and a gate electrode 8.

In the second embodiment, a pull-up electrode 18 is stacked on the gate electrode 8 through a dielectric film 16.

The dielectric film 16 is comprised of a high temperature chemical vapor deposited oxide (HTO) film or CVD-SiO$_2$ film. The thickness is for example about 10 nm.

A pull-up electrode 18 is generally comprised of doped poly-Si or a stacked film of a doped poly-Si and a high melting point metal silicide.

The process of production of this nonvolatile memory transistor is the same as that of the first embodiment up to the formation of the top insulating film 14.

In the second embodiment, next, a dielectric film 16 is formed on the top insulating film 14 by HT-CVD or LP-CVD, then a film forming the pull-up electrode 18 is formed by LP-CVD—each to the predetermined thickness.

The dielectric film 16 and the film forming the pull-up electrode 18 are then continuously etched by, for example, RIE along with the underlying top insulating film 14, nitride film 12, and FN tunnel nitride film 10.

This ends the patterning of the gate electrode and the pull-up electrode. Next, the same steps as in the first embodiment are gone through to complete the nonvolatile memory transistor.

Next, an explanation will be made of the write operation.

Figure 10:
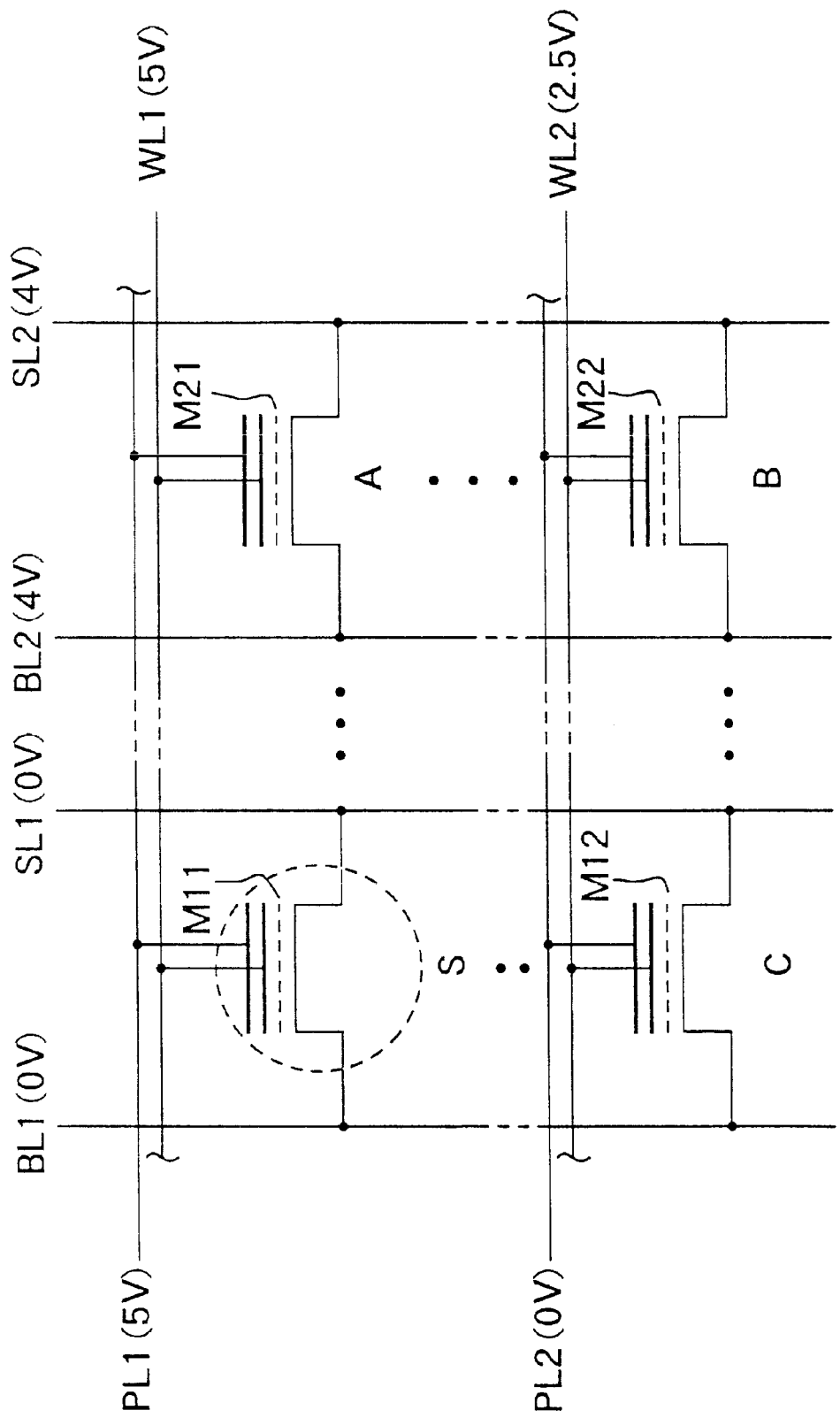
FIG. 10 is a view of an example of the conditions for setting a write bias voltage according to the second embodiment.

FIG. 10 is a view of showing the conditions for setting the write bias voltage of the second embodiment for four types of cells defined in the same way as the first embodiment.

When writing data in the selected cell S, first, the selected bit line BL1 and selected source line SL1 are held at a low level voltage, for example, a ground potential 0V, then a high level voltage, for example, 4V, is set to the other nonselected bit line BL2 and source line SL2. Further, when the substrate potential is 0V, a predetermined voltage, for example, 2.5V, is supplied to the nonselected word line WL2.

In this state, a voltage of not more than 10V, for example, 5V, is supplied to the word line WL1 to which the selected cell S is connected through the selected transistor ST1 so as to precharge the selected word line WL1. Therefore, the potential of the gate electrode of the memory transistor M11 constituting the selected cell S is raised to about 5V, but sufficient writing is not performed at that potential.

Next, the selected transistor ST1 connected to the selected word line WL1 is turned off and the selected word line WL1 electrically floats in state.

Further, next, the selected transistor ST0 to which the pull-up line is connected is turned on and the pull-up gate bias circuit 102 supplies the pull-up line PL1 to which the selected cell S is connected with a predetermined voltage of not more than 10V, for example, 5V.

Due to this, the selected word line WL1 is raised to a writable voltage. The final word line potential Vw after boosting is expressed by the following equation 1:

$$Vw = Vpc + C \times Vpull \quad (1)$$

where,

Vpc is the precharge voltage of the word line,

C is the capacity coupling ratio of the pull-up electrode and word line, and

Vpull is the voltage supplied to the pull-up electrode (pull-up voltage).

In the above example, both the precharge voltage Vpc and the pull-up voltage Vpull are 5V. Here, if the capacity coupling ratio is 0.6, from equation (1), the word line potential Vw after boosting becomes 8V. This word line potential Vw of 8V corresponds to a word line supply voltage of 11 to 11.5V in the case where the tunnel insulating film is comprised of silicon oxide like in the first embodiment (FIG. 7).

As a result, the charge passes through the FN tunnel nitride film 10 for FN tunneling to the charge storing means (carrier traps) of the memory transistor M11 of the selected cell S from the entire surface of the channel forming region 1a of the semiconductor substrate 1. The threshold voltage Vth thereby changes and the data is written.

In this way, in the write operation of the second embodiment, a high speed write operation of 1 msec is achieved by a word line supply voltage 5V (word line potential of 8V after boosting).

Further, for the same reasons, erasing is possible by an erase voltage of −5V at the same speed (100 msec) as with an erase voltage of −7V of the related art.

Due to the above, it is possible to provide the operating voltage at a greatly reduced voltage level from the word line supply voltage, that is, 5V at the time of a write operation and −5V at the time of an erase operation. As a result, it is possible to extremely simplify the configuration of the not shown operating voltage generating circuit and further possible to achieve a reduction of the chip area and a reduction of the power consumption.

Note that in the second embodiment as well, in the same way as the first embodiment, it is possible to supply a negative voltage to the well in order to further reduce the voltage.

Further, in the second embodiment as well, in the same way as the first embodiment, the reducing action of the FN tunnel nitride film improves the endurance characteristic. Further, since the tunnel insulating film is relatively thick, the data retention (charge holding) characteristics after data rewrites, the disturbance characteristic, and other facets of its reliability are improved.

Third Embodiment

The third embodiment relates to a nonvolatile semiconductor memory having miniature NOR type cells with bit lines and source lines formed in a hierarchy structure.

Figure 11:
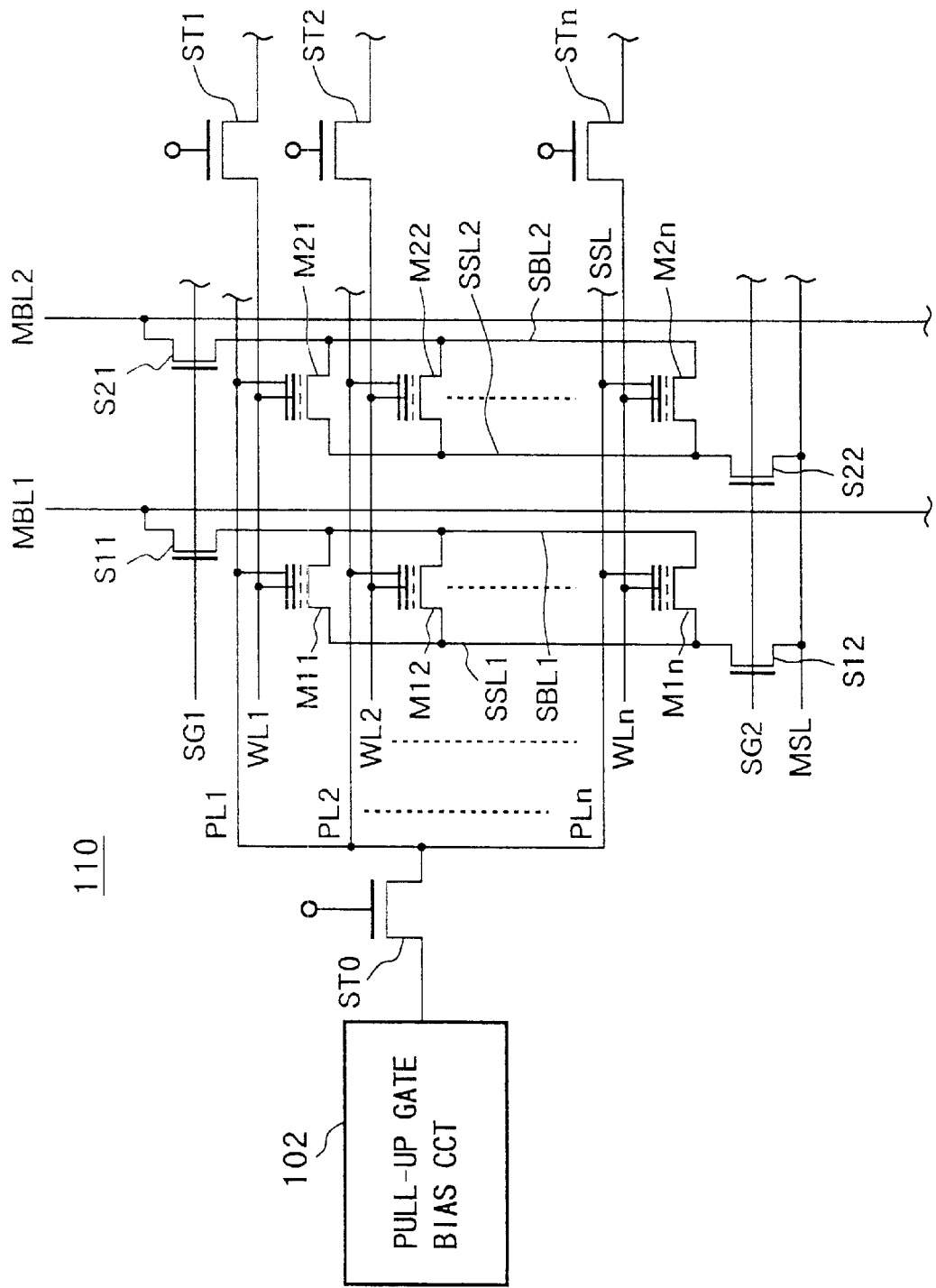
FIG. 11 is a view of the general configuration of a nonvolatile semiconductor memory according to a third embodiment of the present invention.

FIG. 11 is a view of the general configuration of a nonvolatile semiconductor memory according to the third embodiment.

In the nonvolatile memory device 110 of the third embodiment, the bit lines are divided into main bit lines and sub bit lines while the source lines are divided into main source lines and sub source lines. The sub bit line SBL1 is connected to the main bit line MBL1 through the selected transistor S11, while the sub bit line SBL2 is connected to the main bit line MBL2 through the selected transistor S21. Further, the sub source line SSL1 is connected to the main source line MSL through the selected transistor S12, while the sub source line SSL2 is connected through the selected transistor S22.

The memory transistors M11 to M1n are connected in parallel between the sub bit line SBL1 and the sub source line SSL1, while the memory transistors M21 to M2n are connected in parallel between the sub bit line SLB2 and the sub source line SSL2. The n number of memory transistors connected in parallel to each other and the two selector transistors (S11 and S12 or S21 and S22) constitute a unit block constituting the memory array.

The gates of the memory transistors M11, M21, . . . adjoining each other in the word direction are connected to the word line WL1. Similarly, the gates of the memory transistors M12, M22, . . . are connected to the word line WL2 and the gates of the memory transistors M1n, M2n, . . . are connected to the word line WLn.

The selected transistors S11, S21, . . . adjoining each other in the word direction are controlled by the selection line SG1, while the selected transistors S12, S22, . . . are controlled by the selection line SG2.

The memory transistors have the structure shown in FIG. 9 for example. A pull-up electrode is provided on the gate electrode through a dielectric film. In the same way as the second embodiment, the pull-up electrodes of the memory transistors are connected in common to the pull-up lines arranged in the word direction. Specifically, the pull-up electrodes of the memory transistors M11 and M21 are connected to the pull-up line PL1, the pull-up electrodes of the memory transistors M12 and M22 are connected to the pull-up line PL2, and the pull-up electrodes of the memory transistors M1n and M2n are connected to the pull-up line PLn.

In the same way as the second embodiment, the pull-up gate bias circuit 102 is connected to the pull-up lines PL1, PL2, . . . , PLn through the selected transistor ST0.

In the third embodiment as well, in the same way as the first and second embodiments, by using an FN tunnel nitride film for the tunnel insulating film, it is possible to provide the word line supply voltage (program voltage and erase voltage) by a voltage level greatly reduced from the related art. As a result, it is possible to simplify the configuration of the operating voltage generating circuit. In the same way as the first embodiment, it is possible to reduce the voltage further by supply of a negative voltage to the well and to improve the enhancement characteristic and the reliability after data rewrites.

In the third embodiment, since the bit lines and the source lines are formed in a hierarchy structure and the selected transistor S11 or S21 separates the group of parallel main transistors in the nonselected unit blocks from the main bit line MBL1 or MBL2, the capacitance of the main bit lines is remarkably reduced which is advantageous for increasing the speed and lowering the power consumption. Further, due to the action of the selected transistor S12 or S22, it is possible to separate the sub source lines from the main source lines and thereby reduce the capacity.

In addition, it is possible to form a pseudo contact-less structure where the sub lines (sub bit lines and sub source lines) are made by impurity regions and possible to reduce the effective cell area per bit from the NOR type cell shown in the second embodiment.

For example, by using trench separation, self-aligned fabrication, for example, self-aligned contact formation using miniature NOR type cells shown in FIG. 2, and so forth, it is possible to produce miniature cells with exclusive areas of 6F2, where F is the minimum design rule. At the time of production, the sub bit lines SBL1 and SBL2 or the sub source lines SSL1 and SSL2 are formed by the impurity regions or impurity regions bonded with a silicide, while the main bit lines MBL1 and MBL2 used may be metal lines.

Further, it is possible to use full channel surface write and full channel erase operations.

If using full channel write/erase operations, it is not necessary to use a double diffusion layer structure for suppressing the interband tunnel current in the drain or source impurity regions, so this is superior in terms of the scaling of the source and drain impurity regions of the memory transistors compared with the operation of draining the stored charges to the impurity regions. As a result, it is possible to realize a memory transistor superior in the fine scaling of the cells and therefore having a finer gate length.

Fourth Embodiment

Figure 12:
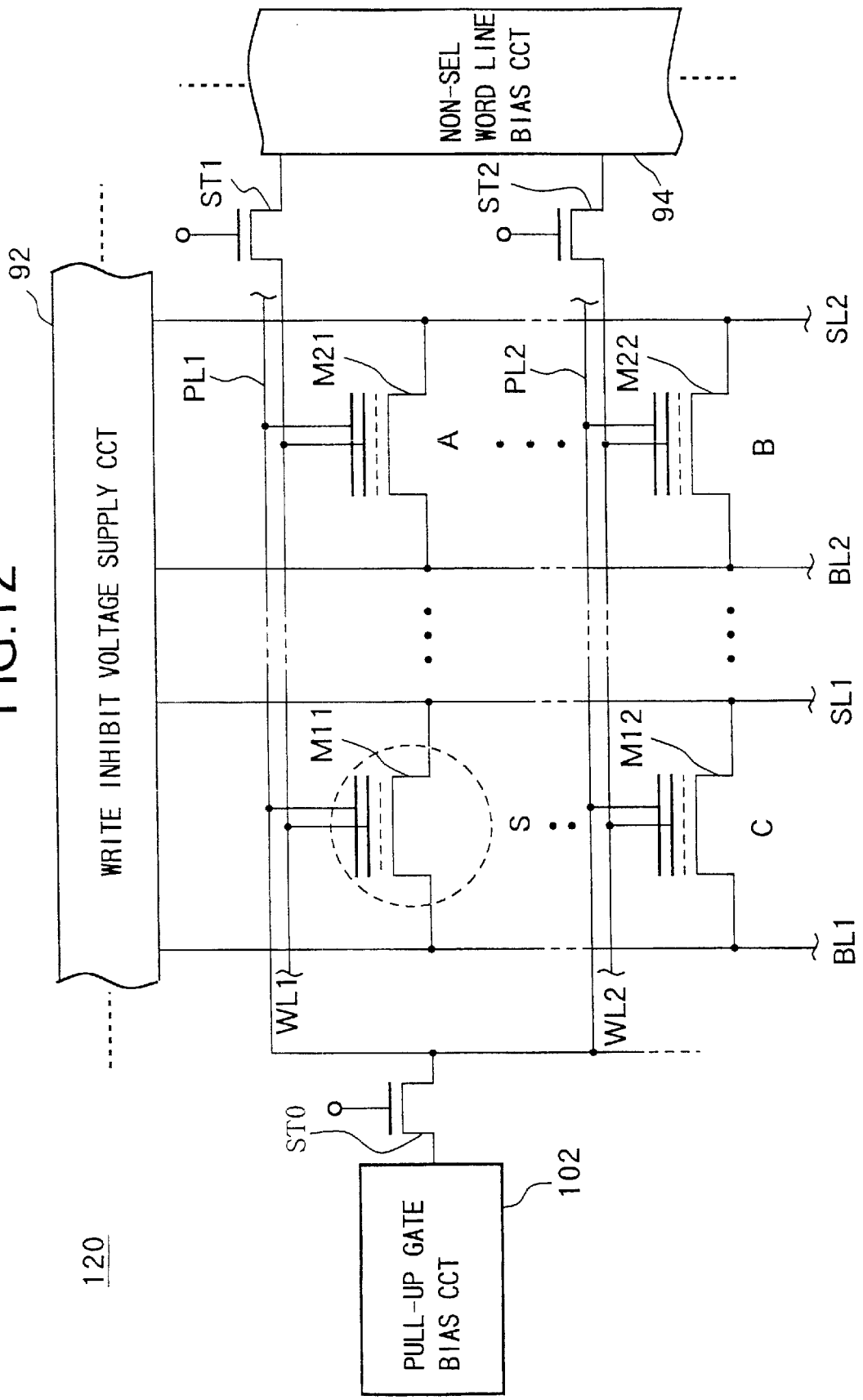
FIG. 12 is a view of the general configuration of a nonvolatile semiconductor memory according to a fourth embodiment of the present invention.

FIG. 12 is a view of the general configuration of a nonvolatile semiconductor memory according to a fourth embodiment of the present invention.

The nonvolatile semiconductor memory 120 of the fourth embodiment is the same as the second embodiment in the configuration of the memory cell array, the structure of the memory transistors, and the process of production.

The configuration for boosting the voltage of the gate electrodes of the memory transistors in the fourth embodiment is similar to those of the second and third embodiments in that, as shown in FIG. 12, a pull-up electrode is provided in the memory transistor, the pull-up lines PL1 and PL2 are connected to the pull-up electrodes, and the pull-up gate bias circuit 102 is connected to the pull-up lines PL1 and PL2 through the selected transistor ST0.

Further, the write and erase methods are basically similar to those of the second embodiment.

However, the difference of the fourth embodiment in configuration from that of the second embodiment is that provision is made of the write inhibit voltage supply circuit 92 and the nonselected word line bias circuit 94 as the specific means for supplying the voltage of 4V for the nonselected bit line BL2 and nonselected source line SL2 of FIG. 10 and supplying the voltage of 2.5V for the nonselected word line WL2 in the same way as the first embodiment.

Table 1 shows the characteristics of the nonvolatile semiconductor memory 120 according to the fourth embodiment.

TABLE 1

| Program condition | 5 V, 1 msec |
|---|---|
| Erase condition | −5 V, 100 msec |
| W/E write life | to $10^6$ cycle |
| Data retention condition | 85° C., 10 years (after 100,000 rewrites) |
| Read disturbance time | 10 years (after 100,000 rewrites) |
| Inhibit S/D voltage | 4 V |
| Junction withstand voltage | 10 V |

In the fourth embodiment, the same program conditions (5V, 1 msec) and erase conditions (−5V, 100 msec) are achieved as in the second embodiment.

Further, it was confirmed that the data write life was 1×106 times, the data retention (charge holding) characteristics were 85° and 10 years after 1 million rewrites, and the read disturbance was one where 10 years could be guaranteed after 1 million rewrites. These measurements were made at an inhibit S/D voltage of 4V.

Further, the main device characteristics were good and the junction withstand (tolerance) voltage of the memory transistor satisfied the 10V requirement.

In the fourth embodiment as well, in the same way as the second embodiment, it was possible to use an FN tunnel nitride film for the tunnel insulating film and to boost the word line voltage to provide a word line supply voltage (program voltage and erase voltage) at a voltage level (for example, 5V) greatly reduced from the related art and as a result possible to simplify the configuration of the operating voltage generating circuit.

The fourth embodiment, like the first embodiment, improves the endurance characteristic and the reliability after data rewrites by increasing the disturbance margin, facilitates the realization of a single transistor cells operating at a low voltage, and as a result enables a reduction of the cell area and in turn a reduction in the chip area and thereby a reduction in the costs and an increase in the capacity.

Fifth Embodiment

The fifth embodiment is a first modification of the element structure of a nonvolatile memory.

Figure 13:
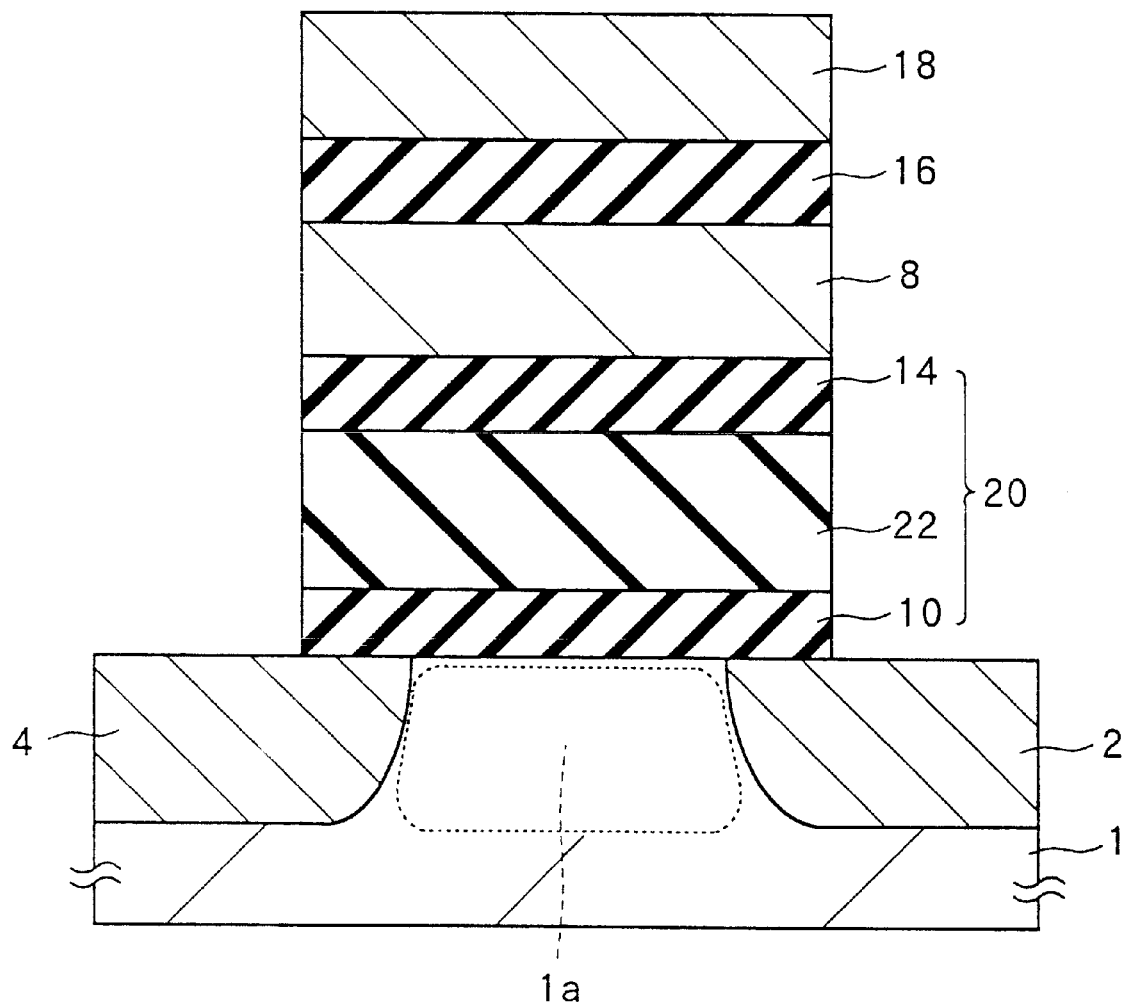
FIG. 13 is a sectional view of the element structure of a MONOS type memory transistor according to a fifth embodiment of the present invention.

FIG. 13 is a sectional view of the element structure of a memory transistor of the fifth embodiment.

The nonvolatile memory transistor of the fifth embodiment differs from that of the second embodiment in that the gate insulating film 20 of the fifth embodiment is provided with an oxynitride film 22 in place of the nitride film 12.

The rest of the configuration, that is, the semiconductor substrate 1, source region 2, drain region 4, channel forming region 1a, tunnel insulating film 10, top insulating film 14, gate electrode 8, dielectric film 16, and pull-up electrode 18, are similar to these of the second embodiment. The oxynitride film 22 can be made a relatively thin 3.0 nm for example since an FN tunnel nitride film is used for the tunnel insulating film 10 in the same way as the first and second embodiments.

In the production of a memory transistor of this configuration, after the formation of the tunnel insulating film 10, the oxynitride film 22 is deposited thickly by for example LP-CVD to give a final thickness of 3.0 nm. The CVD is performed using a mixed gas for example of DCS, ammonia, and $N_2O$ and at a substrate temperature of 650° C. In the formation of an oxynitride film over the heat oxidized film ($SiO_xN_y$ film; 0<x<1, 0<y<1), if necessary, it is possible to optimize the pretreatment (wafer pretreatment) and film forming conditions of the underlying surface in advance in the same way as the first embodiment. Next, in the same way as the first and second embodiments, the top insulating film 14, the gate electrode 8, the dielectric film 16, and the pull-up electrode 18 are formed and processed to complete the MONOS type memory transistor.

In the fifth embodiment too, like the first and second embodiments, good characteristics are obtained as a single transistor cell able to operating at a low voltage.

The fifth embodiment, like the second embodiment, gives the effect by pulling up the potential of the gate electrode.

Sixth Embodiment

The sixth embodiment is a second modification of the element structure of a nonvolatile memory.

Figure 14:
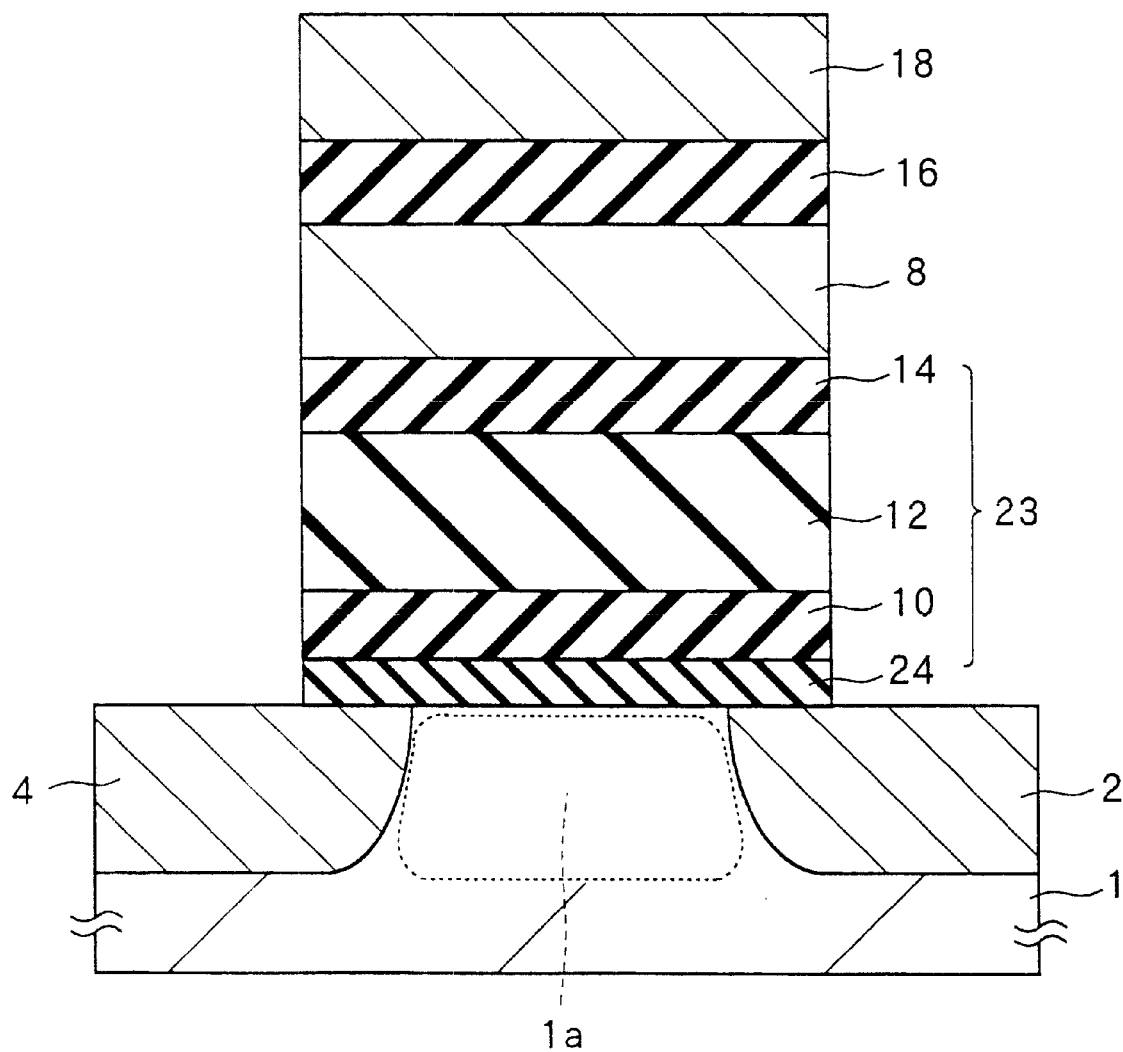
FIG. 14 is a sectional view of the element structure of a MONOS type memory transistor according to a sixth embodiment of the present invention.

FIG. 14 is a sectional view of the element structure of a memory transistor of the sixth embodiment.

The nonvolatile memory transistor of the sixth embodiment differs from that of the second embodiment in that the gate insulating film 23 of the sixth embodiment provides a buffer layer 24 between the FN tunnel nitride film 10 and the substrate 1. The buffer layer 24 is a thin PF film formed by heat nitridation of the substrate surface and acts to suppress the generation of the interfacial level at the substrate surface.

The rest of the configuration, that is, the semiconductor substrate 1, source region 2, drain region 4, channel forming region 1a, tunnel insulating film 10, nitride film 12, top insulating film 14, gate electrode 8, dielectric film 16, and pull-up electrode 18, are similar to those of the second embodiment. The nitride film 12 can be made a relatively thin 3.0 nm for example since an FN tunnel nitride film is used for the tunnel insulating film 10 in the same way as the first and second embodiments.

The memory transistor of this configuration is produced in the same way as the first and second embodiments except for the heat nitridation of the substrate surface at the start of the formation of the gate insulating film.

In the sixth embodiment too, like the first and second embodiments, good characteristics are obtained as a single transistor cell able to operate at a low voltage.

The sixth embodiment, like the first and second embodiments, gives the effect by pulling up the potential of the gate electrode.

In particular, in the sixth embodiment, since the boundary (interfacial) energy level of the substrate surface is suppressed and the probability of the carriers being trapped there is reduced, the amount of charge held becomes greater and the characteristics are improved. Further, the buffer layer 24 eases the strain on the FN tunnel nitride film 10 and therefore there is no increase in the number of carrier traps of the FN tunnel nitride film 10 due to the strain.

Seventh Embodiment

The seventh embodiment is a third modification of the element structure of a nonvolatile memory.

Figure 15:
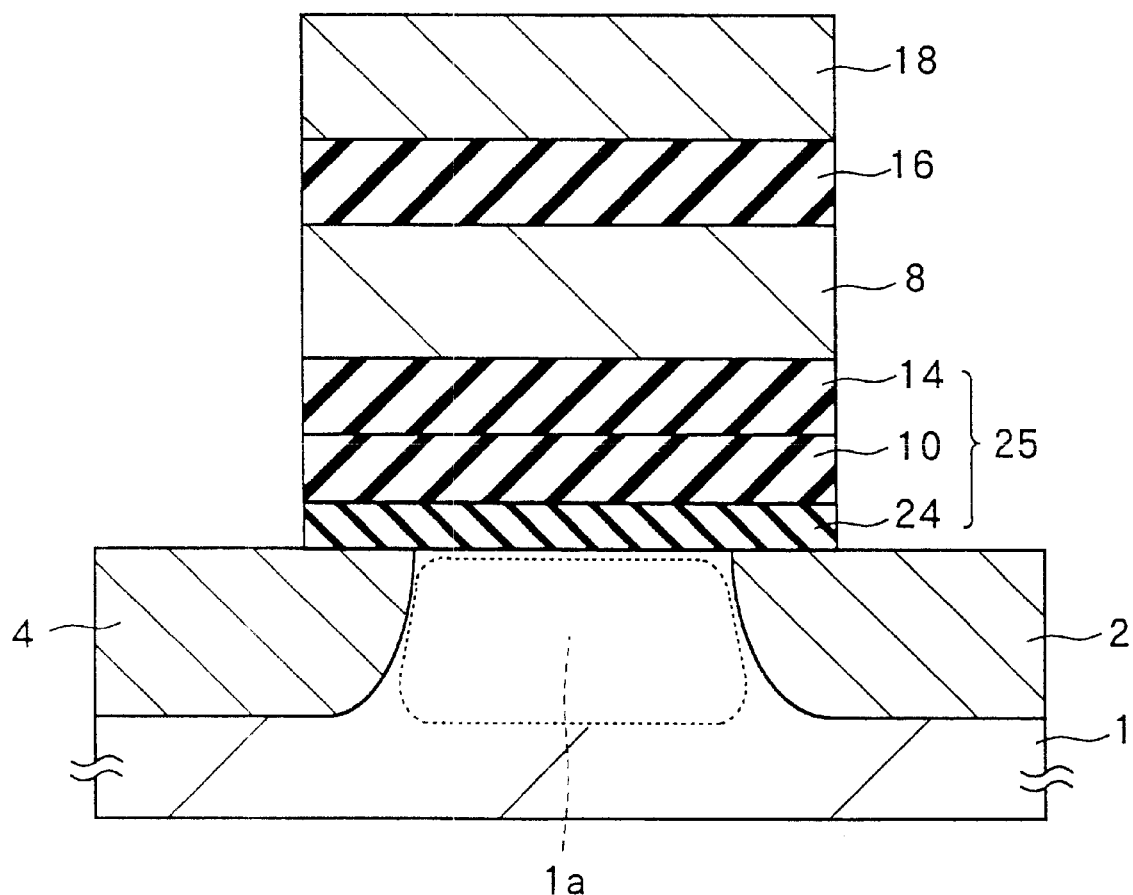
FIG. 15 is a sectional view of the element structure of a MONOS type memory transistor according to a seventh embodiment of the present invention.

FIG. 15 is a sectional view of the element structure of a memory transistor of the seventh embodiment.

The nonvolatile memory transistor of the seventh embodiment differs from that of the first to sixth embodiments in that the gate insulating film 25 of the seventh embodiment omits the nitride film 12 (or oxynitride film 22) deposited by LP-CVD and exhibiting a PF electroconductivity and enables the top insulating film 14 to be directly formed on the FN tunnel nitride film 10.

The FN tunnel nitride film 10 has a relatively low density of carrier traps in the film compared with a PF film, so the carrier traps formed at the boundary (interface) with top insulating film 14 are mainly responsible for holding the charges. The seventh embodiment shows that it is possible to make the thickness of the PF film, which had to reduced to a thickness of about 3 nm in the previous embodiments, to 0, that is to omit it, when there are sufficient carrier traps for holding the charges.

To keep down the reduction in the number of carrier traps for holding a charge due to the film stress as much as possible, it is desirable to provide a buffer layer 24 at the bottommost layer of the gate insulating film in the same way as in the sixth embodiment.

The rest of the configuration, that is, the semiconductor substrate 1, source region 2, drain region 4, channel forming region 1a, tunnel insulating film 10, top insulating film 14, gate electrode 8, dielectric film 16, and pull-up electrode 18, are similar to those of the first to sixth embodiments.

The memory transistor of this configuration is produced in the same way as the first to sixth embodiments except for omitting the PF film (nitride film 12 or oxynitride film 22).

In the seventh embodiment, it is possible to further reduce the operating voltage from the first to sixth embodiments by just omitting the PF film (nitride film 12 or oxynitride film 22).

The seventh embodiment, like the second embodiment, gives the effect by pulling up the potential of the gate electrode.

Further, when providing the buffer layer 24, the boundary (interfacial) energy level of the substrate surface is suppressed and the probability of the carriers being trapped is reduced.

Eighth Embodiment

The eighth embodiment is a fourth modification of the element structure of a nonvolatile memory.

Figure 16:
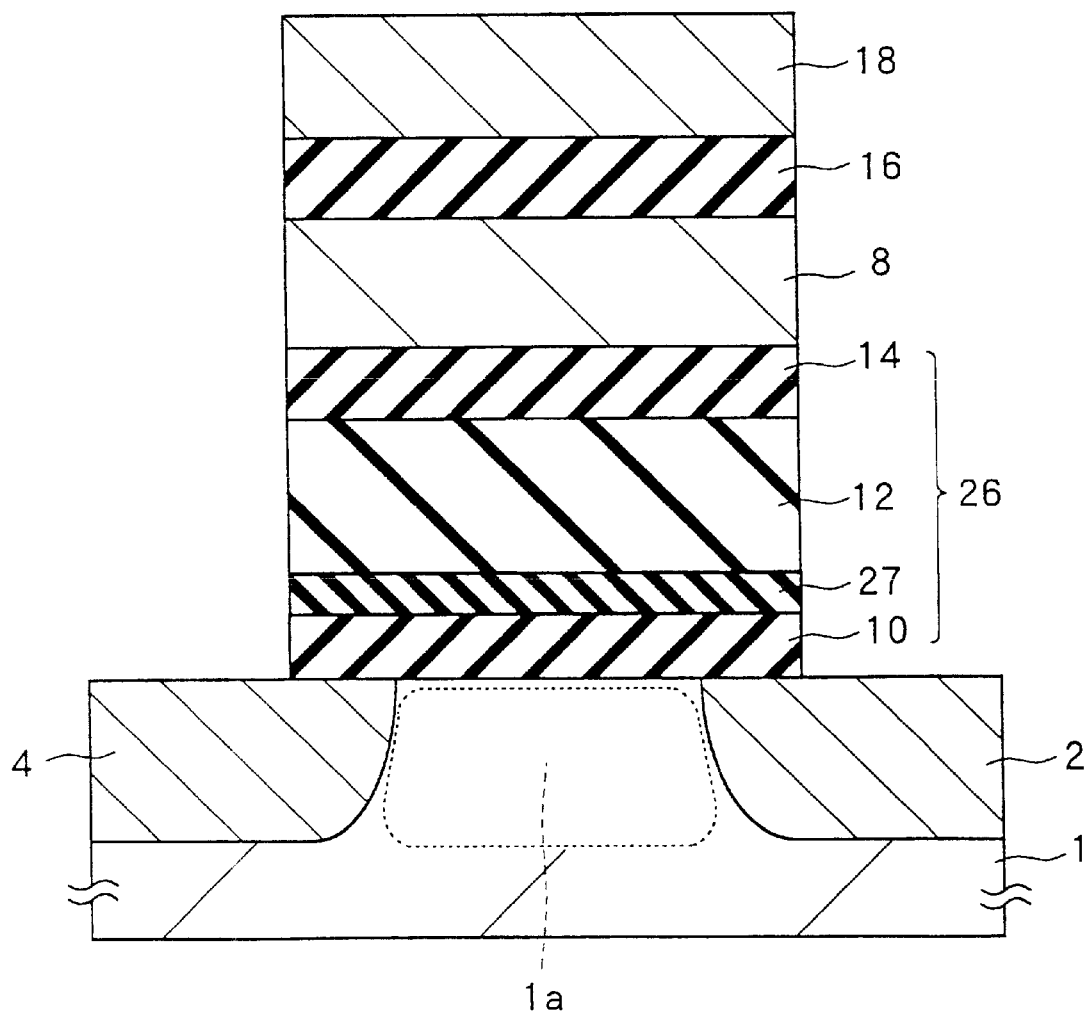
FIG. 16 is a sectional view of the element structure of a MONOS type memory transistor according to an eighth embodiment of the present invention.

FIG. 16 is a sectional view of the element structure of a memory transistor of the eighth embodiment.

The nonvolatile memory transistor of the eighth embodiment differs from that of the previous second embodiment in that the gate insulating film 26 of the eighth embodiment provides a buffer layer 27 between the FN tunnel nitride film 10 and the PF film (nitride film 12). The buffer layer 27 acts to prevent the effect from the upper layer nitride film 12 side due to heating and so forth after formation of the FN tunnel nitride film 10, for example, the change in quality near the interface with the nitride film 12 and the effective reduction in the thickness of the FN tunnel nitride film 10.

The rest of the configuration, that is, the semiconductor substrate 1, source region 2, drain region 4, channel forming region 1a, tunnel insulating film 10, nitride film 12, top insulating film 14, gate electrode 8, dielectric film 16, and pull-up electrode 18, are similar to those of the first and second embodiments. The nitride film 12 can be made a relatively thin 3.0 nm for example since an FN tunnel nitride film is used for the tunnel insulating film 10 in the same way as the first and second embodiments.

The memory transistor of this configuration is produced in the same way as the first and second embodiments except for the formation of the nitride film 12 after formation of the buffer layer 27 by the above method after formation of the FN tunnel nitride film 10.

In the eighth embodiment too, like the first and second embodiments, good characteristics are obtained as a single transistor cell able to operating at a low voltage.

The eighth embodiment, like the second embodiment, gives the effect by pulling up the potential of the gate electrode.

In particular, in the eighth embodiment, there is the advantage of the buffer layer 27 effectively preventing the upper layer film from affecting the FN tunnel nitride film 10 and keeping the quality, thickness, and so forth of the FN tunnel nitride film 10 from changing in the middle of production.

Ninth Embodiment

The ninth embodiment relates to a nonvolatile semiconductor memory device using as charge storing means of the memory transistor a large number of mutually insulated Si nanocrystals having a particle size of for example not more than 10 nanometers buried in the gate insulating film (hereinafter referred to as the Si nanocrystal type).

Figure 17:
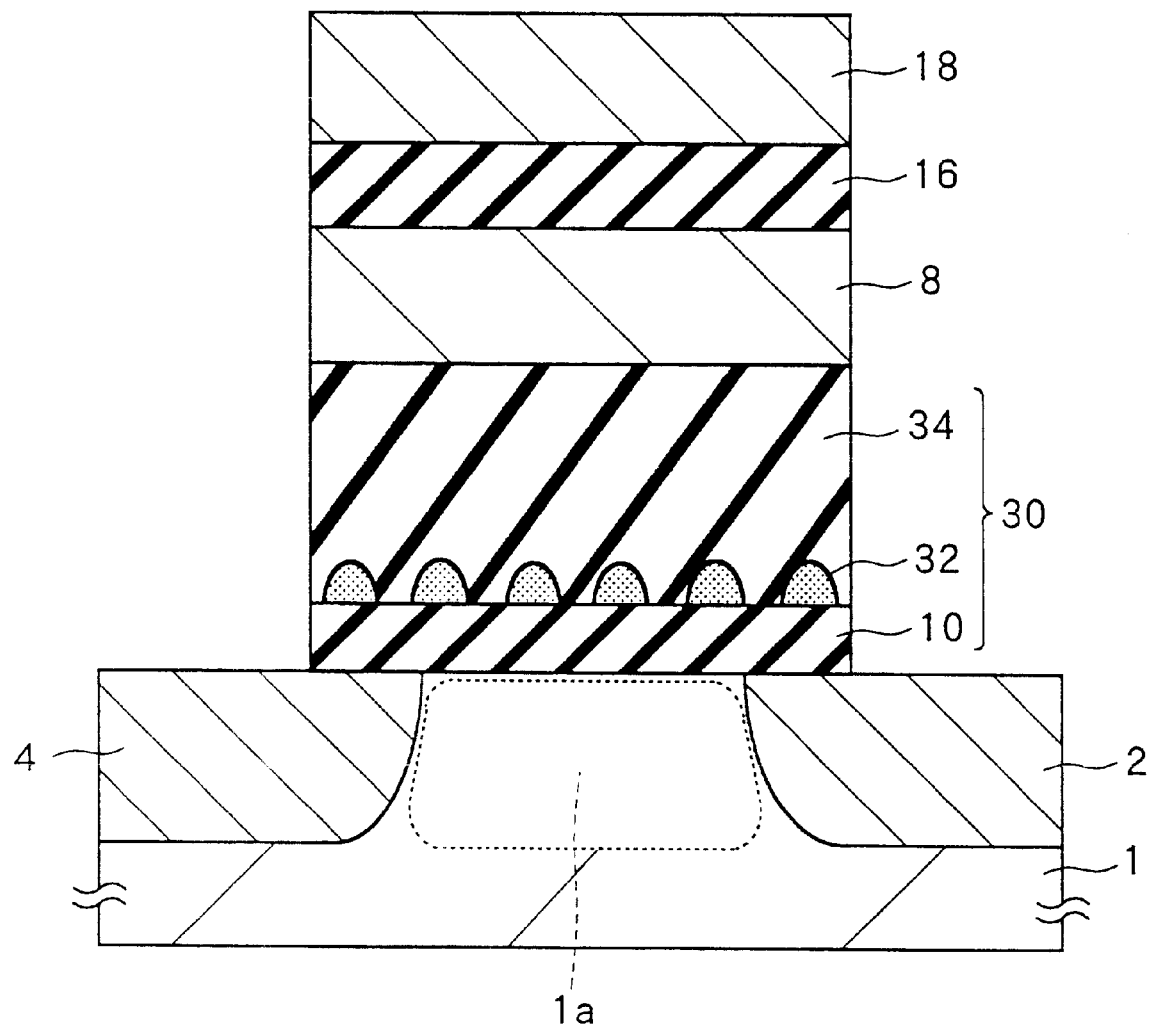
FIG. 17 is a sectional view of the element structure of an Si nanocrystal type memory transistor according to a ninth embodiment of the present invention.

FIG. 17 is a sectional view of the element structure of an Si nanocrystal type memory transistor of the ninth embodiment.

The Si nanocrystal nonvolatile memory transistor of the ninth embodiments differs from that of the first to eighth embodiment in that instead of the nitride film 12 and the top insulating film 14, it forms the Si nanocrystals 32 forming the charge storing means on the tunnel insulating film 10 and the oxide film 34 over it with the gate electrode 8.

The rest of the configuration, that is, the semiconductor substrate 1, channel forming region 1a, source region 2, drain region 4, tunnel insulating film 10, gate electrode 8, dielectric film 16, and pull-up electrode 18, are similar to those of the previous embodiments.

The Si nanocrystals 32 have a size (diameter) of preferably not more than 10 nm, for example, about 4.0 nm. The individual Si nanocrystals are separated spatially at the oxide film 34 at intervals of for example 4 nm or so.

The tunnel insulating film 10 at the ninth embodiment is somewhat thicker than the first embodiment due to the closeness of the charge storing means (Si nanocrystals 32) to the substrate side. The thickness may be suitably selected in the range from 2.6 nm to 5.0 nm in accordance with the application of the nonvolatile semiconductor memory. Here, it is made a thickness of about 4.0 nm.

The memory transistor of this configuration is produced by forming the tunnel insulating film 10, then forming a plurality of Si nanocrystals 42 on the tunnel insulating film 10 by for example LP-CVD. Further, the oxide film 44 is formed by for example LP-CVD to, for example, 7 nm in a form burying the Si nanocrystals 42. In this LP-CVD, the material gas is a mixed gas of DCS and N2O and the substrate temperature is, for example, 700° C. At this time, the Si nanocrystals 32 are buried in the oxide film 34 and the surface of the oxide film 34 planarized. When the planarization is insufficient, a new planarization process (for example, CMP and so forth) may be performed. Next, the films forming the gate electrode 8, dielectric film 16, and pull-up electrode 18 are formed and processed to complete the Si nanocrystal type memory transistor.

The Si nanocrystals 32 formed in this way function as carrier traps dispersed in the planar direction. The trap level can be deduced by the band discontinuity with the surrounding silicon oxide. It is deduced to be about 3.1 eV or so. Individual Si nanocrystals 32 of this size can hold several electrons. Note that the Si nanocrystals can also be made smaller and made to hold single electrons.

The data retention (charge holding) characteristics of an Si nanocrystal type nonvolatile memory of this configuration was studied by a land cast back tunneling model. To improve the data retention (charge holding) characteristics, it is important to make the trap level deep and increase the distance between the center of the charge and the semiconductor substrate 1. Therefore, the data retention (charge holding) characteristics in the case of a trap level of 3.1 eV was studied by simulation using a land cast model as a physical model. As a result, it was understood that by using deep carrier traps of a trap level of 3.1 eV, a good data retention (charge holding) characteristic is exhibited even with a relatively close distance from the charge accumulating (storing) medium to the channel forming region 1a of 4.0 nm. Results were obtained as expected.

Next, low voltage programming was studied. The write time in the ninth embodiment is not more than 1 msec at a program voltage of a low 3V due to the effective action of the boosting effect of the word line by the pull-up electrode. The high speed write characteristic of the Si nanocrystal type was therefore verified.

10th Embodiment

The 10 th embodiment relates to a nonvolatile semiconductor device using a large number of fine divided type floating gates.

Figure 18:
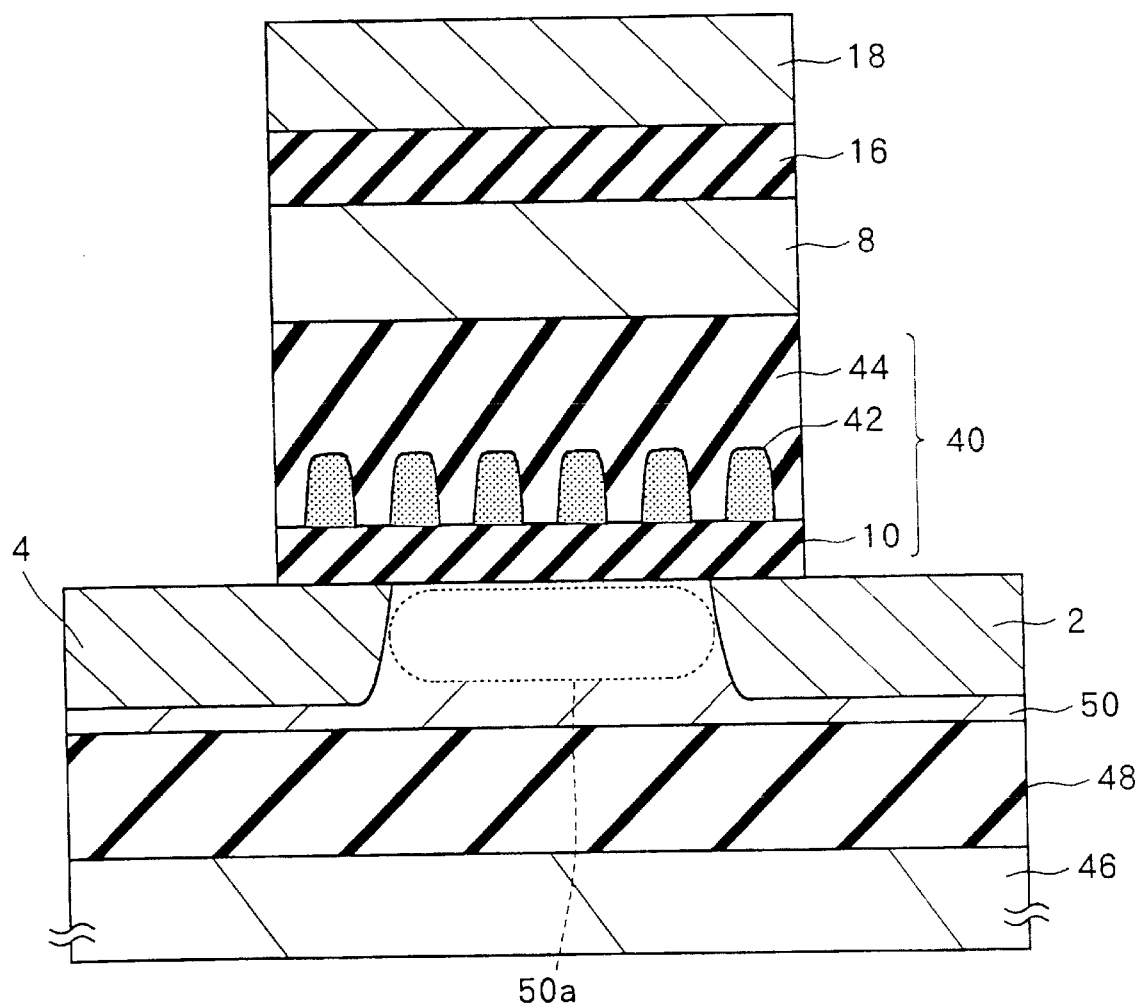
FIG. 18 is a sectional view of the element structure of a fine divided FG type memory transistor according to a tenth embodiment of the present invention.

FIG. 18 is a sectional view of the element structure of a fine divided FG type memory transistor of the 10th embodiment.

The fine divided FG type nonvolatile memory of the 10th embodiment differs from the first to ninth embodiments in the formation of the memory transistors on a semiconductor-on-insulator (SOI) substrate, in the formation of the gate insulating film 40 of the 10th embodiment in place of the nitride film 12 and the top insulating film 14, and in the formation of the fine divided type floating gate 42 and oxide film 44 over that forming the charge storing means on the tunnel insulating film 10 with the gate electrode 8.

In the rest of the configuration, the tunnel insulating film 10, gate electrode 8, dielectric film 16, and pull-up electrode 18 are the same as in the first to ninth embodiments.

The fine divided floating gate 42 corresponds to a specific example of the Si nanocrystal of the fifth embodiment and "small particle size conductors" spoken of in the present invention.

As the SOI substrate, use may be made of a separation-by-implanted-oxygen (SIMOX) substrate comprised of a silicon substrate doped with oxygen ions at a high concentration to form a buried oxide film at a location deeper than the substrate surface, a bonded substrate comprised of one silicon substrate formed with an oxide film on its surface bonded with another substrate, and so forth. The SOI substrate formed by this method and shown in FIG. 12 is comprised of a substrate 46, a divided oxide film 48, and a silicon layer 50. A channel forming region 50a, source region 2, and drain region 4 are provided in the silicon layer 50.

Here, as the substrate 46, use may be made of not only a semiconductor substrate, but also a glass substrate, plastic substrate, sapphire substrate, and other substrates other than semiconductor substrates.

The fine divided floating gate 42 comprises a normal FG type floating gate processed into fine poly-Si dots of a height of, for example, 5.0 nm or so and a diameter of up to 8 nm.

The tunnel insulating film 10 in the 10th embodiment is somewhat thicker than that of the first embodiment, but is formed much thinner than the normal FG type. The thickness may be suitably selected from a range of 2.5 nm to 4.0 nm in accordance with the application of the nonvolatile semiconductor memory. Here, it is made the thickness, i.e., 4.0 nm.

In the production of the memory transistor of this configuration, a tunnel insulating film 10 is formed on the SOI substrate, then for example a polycrystalline silicon film (final thickness: 5 nm) is formed on the tunnel insulating film 10. In LP-CVD, the material gas is made a mixed gas of DCS and ammonia and the substrate temperature is made for example 650° C. Next, for example, electron beam exposure is used to process the polycrystalline silicon film into fine poly-Si dots of a diameter of for example up to 8 nm. The poly-Si dots function as a fine divided type floating gate 42 (charge storing means). Next, an oxide film 44, is formed, to a thickness of for example up to 9 nm by LP-CVD in a form burying the fine divided type floating gate 42. In the LP-CVD, the material gas is made a mixed gas of DCS and N2O and the substrate temperature is made for example 700° C. At this time, the fine divided type floating gate 42 is buried in the oxide file 44 and the surface of the oxide film 44 is planarized. When the planarization is insufficient, a new planarization process (for example, CMP and so forth) may be performed. Next, the films forming the gate electrode 8, dielectric film 16, and pull-up electrode 18 are formed and processed to complete the fine divided FG type memory transistor.

In this way, an SOI substrate was used and the floating gate finely divided. An element was produced and the characteristics evaluated. As a result, it was confirmed that good characteristics were obtained as predicted.

Modifications

Various modifications may be made in the first to 10th embodiments explained above.

For example, the tunnel insulating film 10 is not limited to an FN tunnel nitride film. It may also be configured by an oxynitride film, aluminum oxide film, tantalum pentaoxide film, or BST film exhibiting an FN tunneling electroconductivity.

Further, the other film exhibiting a PF electroconductivity may be comprised of any of a nitride film, oxynitride film, aluminum oxide film, or tantalum pentaoxide film.

For example, in the above explanation, the top insulating film 14 was made a single oxide film, but it is also possible to make the top insulating film 14 a plurality of stacked films.

For example, the top insulating film 14 may be comprised of a bottom layer of an oxide film and a top layer of an FN tunnel nitride film. Due to this, it is possible to further reduce the thickness of the ONO film converted to that of a silicon oxide film and as a result to further reduce the operating voltage.

Further, it is possible to comprise the top insulating film 14 from a bottom layer of a heat oxide film and a top layer of a CVD oxide film. Due to this, when reducing the thickness of the intermediate nitride film of the ONO film, it is possible to suppress the faster oxidation when forming the top insulating film by heat oxidation of the nitride film and further possible to reduce the total amount of high temperature heating, that is, the thermal budget.

The pull-up lines PL1, PL2 . . . . in the second to 10th embodiments are connected through the selected transistors with different pull-up lines to the pull-up gate bias circuit 102. The pull-up lines PL1, PL2, . . . may be individually controlled by the pull-up gate bias circuit 102.

The cell pattern is not limited to FIG. 2. Further, the element structure is not limited to FIG. 3, FIG. 9, and FIG. 13 to FIG. 19.

For example the pull-up electrode 11 may be arranged close to the gate electrode 8 through the dielectric film 16. The pattern need not be the same as the gate electrode 8. To raise the capacity coupling ratio of the electrodes 8 and 18, it is preferable that the pull-up electrode 18 cover the top surface and side surfaces of the gate electrode 8. Further, it is also possible to not divide the pull-up electrode 18, but for example to form it into a plate for each area comprised of units of a predetermined number of blocks.

Further, the source region 2 and drain region 4 may be formed, without doping impurities, by inducing a reversal layer in accordance with the voltage supplied to the nearby electrode through the insulating film. In this case, the source line and bit line are capacity coupled with the source region 2 and the drain region 4.

The "planarly dispersed charge storing means" in the present invention means carrier traps of the nitride film bulk, carrier traps formed near the interface between the oxide film and nitride film, nanocrystals of silicon and so forth of a particle size of for example not more than 10 nm mutually insulated from each other, a fine divided floating gate of polycrystalline silicon and so forth divided into fine dots, and so forth.

Therefore, in addition to the above embodiments, it is possible to apply the present invention even to an MNOS type where the basic film structure of the gate insulating film is comprised of two layers of a nitride film and FN tunnel film. Note that as the FN tunnel film in this case, a material which enables sufficient formation of carrier traps near the interface with the nitride film and has a larger dielectric constant than silicon oxide is selected.

The explanation of the first embodiment assumed that the write inhibit voltage supply circuit 92 gave the same reverse bias voltage simultaneously to both of the source region 2 and the drain region 4 of a memory transistor, but the present invention is not limited to the same reverse bias voltage. Further, it is possible to give a reverse bias voltage to one of the source region 2 and drain region 4 and leave the other open. Further, it is possible to supply different voltages to the source line and bit line.

Looking at the fine cell structure with the bit lines or source lines separated into different classes, the present invention may be applied to not only the configuration of FIG. 7 known as the so-called AND type but also for example the DINOR type and a fine NOR type cell known as a so-called HiCR type comprised of a divided source line type memory cell array where source lines are shared by two adjoining source regions.

Further, it is possible to apply the present invention even to a so-called NAN type cell structure. In that case, while not particularly shown, n number of memory transistors M11 to M1*n* or M21 to M2*n* connected in parallel in each unit block in FIG. 11 are connected in series between the selected transistors S11 and S12 or the selected transistors S21 and S22.

The present invention was explained with reference to a one-transistor memory cell, that is, a memory cell using a single transistor, but making the tunnel insulating film an FN tunnel nitride film or boosting the gate electrode by capacity coupling with a pull-up electrode so as to reduce the operating voltage is effective even for a two-transistor memory cell providing each memory cell with a selected transistor controlling the connection with common lines of the memory transistors.

Further, the present invention can also be applied to an enhancement type nonvolatile memory provided with logic circuits on the same substrate in addition to a stand alone type nonvolatile memory.

Note that the embodiments may be combined in any way. Further, use of an SOI substrate as in the 10th embodiment can be applied additionally over the memory transistor structure of the first to ninth embodiments.

Summarizing the effect of the invention, according to the nonvolatile semiconductor memory device, process of production, and write method of the present invention, it is possible to reduce the effective thickness of the gate insulating film and reduce the operating voltage.

Further, it is possible to boost the gate electrode (or word line) of the memory transistor precharged by the write voltage by the voltage supplied to the pull-up electrode. Therefore, it is possible to further reduce the write voltage without reducing the write speed and possible to correct the asymmetry of the write voltage and erase voltage.

Further, the program disturbance margin of the nonselected memory transistor is increased and as a result realization of a one-transistor memory cell operating at a low voltage becomes easy.

What is claimed is:

1. A process of producing a nonvolatile semiconductor memory device, including the steps of:

forming a drain region, a source region and a channel forming region arranged between the drain region and the source region and contacted to them;

forming a gate insulating film including a charge storing means formed on and facing the surface of the channel forming region; and forming a gate electrode on the gate insulating film, said gate insulating film formation step including a step of forming a Fowler-Nordheim (FN) type tunneling film comprising material having an FN tunneling electroconductivity and having a dielectric constant larger than that of silicon oxide, and said FN tunneling film forming step including a step of heating the FN tunneling film at a high temperature under an atmosphere of reduction gas and/or oxidation gas.

2. A process of producing a nonvolatile semiconductor memory device according to claim 1, wherein the FN tunneling film comprises any one of a nitride film, an oxynitride film, an aluminum oxide film, a tantalum pentaoxide film and a BST ($BasRTiO_3$) film, having an FN tunneling electroconductivity.

3. A process of producing a nonvolatile semiconductor memory device according to claim 1, further including a step of forming a buffer layer formed between the FN tunneling film and the channel forming region and suppressing an interface trap level, before forming the FN tunneling film.

4. A process of producing a nonvolatile semiconductor memory device according to claim 1, further including a step of forming a Pool-Frenkel (PF) type film including any one of a nitride film, an oxynitride film, an aluminum oxide film, a tantalum pentaoxide film and a BST ($BasRTiO_3$) film, having an PF electroconductivity, on the FN tunneling film.

5. A process of producing a nonvolatile semiconductor memory device according to claim 1, further including a step of forming a PN film on the FN tunneling film via the buffer layer, said PN film comprising any one of a nitride film, an oxynitride film, an aluminum oxide film, a tantalum pentaoxide film and a BST ($BasRTiO_3$) film, having a PF electroconductivity.

* * * * *

UNITED STATES PATENT AND TRADEMARK OFFICE
CERTIFICATE OF CORRECTION

PATENT NO.     : 6,541,326 B2
DATED          : April 1, 2003
INVENTOR(S)    : Ichiro Fujiwara It is certified that error appears in the above-identified patent and that said Letters Patent is hereby corrected as shown below:

<u>Column 28,</u>
Lines 9, 21 and 28, please replace "($BasRTiO_3$)" with -- ($BaSrTiO_3$) --.

Signed and Sealed this

Seventh Day of October, 2003

JAMES E. ROGAN
*Director of the United States Patent and Trademark Office*